United States Patent
Bret et al.

(10) Patent No.: US 9,721,754 B2
(45) Date of Patent: Aug. 1, 2017

(54) METHOD AND APPARATUS FOR PROCESSING A SUBSTRATE WITH A FOCUSED PARTICLE BEAM

(75) Inventors: Tristan Bret, Darmstadt (DE); Petra Spies, Mainz (DE); Thorsten Hofmann, Rodgau (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 325 days.

(21) Appl. No.: 13/103,281

(22) Filed: May 9, 2011

(65) Prior Publication Data
US 2012/0273458 A1    Nov. 1, 2012

Related U.S. Application Data

(60) Provisional application No. 61/479,018, filed on Apr. 26, 2011.

(51) Int. Cl.
*H01J 37/304* (2006.01)
*B82Y 10/00* (2011.01)
*B82Y 40/00* (2011.01)
*G03F 1/74* (2012.01)
*H01J 37/305* (2006.01)

(52) U.S. Cl.
CPC .......... *H01J 37/3045* (2013.01); *B82Y 10/00* (2013.01); *B82Y 40/00* (2013.01); *G03F 1/74* (2013.01); *H01J 37/3056* (2013.01); *H01J 2237/31737* (2013.01); *H01J 2237/31744* (2013.01)

(58) Field of Classification Search
None
See application file for complete search history.

(56) References Cited

U.S. PATENT DOCUMENTS

| | | | |
|---|---|---|---|
| 4,109,029 A | 8/1978 | Ozdemir et al. | |
| 5,504,339 A | 4/1996 | Masuda | |
| 6,190,836 B1 * | 2/2001 | Grenon et al. | 430/311 |
| 6,740,456 B2 * | 5/2004 | Kanamitsu | 430/5 |
| 6,768,113 B2 | 7/2004 | Suzuki et al. | |
| 6,984,591 B1 * | 1/2006 | Buchanan et al. | 438/778 |
| 7,018,683 B2 | 3/2006 | Takaoka et al. | |

(Continued)

FOREIGN PATENT DOCUMENTS

| | | | |
|---|---|---|---|
| EP | 1 662 538 | 5/2006 | ............. H01J 37/04 |
| JP | H04-050844 | 2/1992 | |

(Continued)

OTHER PUBLICATIONS

Stevie (Giannuzzi, Lucille, and Fred Stevie, eds. "Introduction to Focused Ion Beams". Springer, 2005. pp. 53-71).*

(Continued)

*Primary Examiner* — Joel Horning
(74) *Attorney, Agent, or Firm* — Fish & Richardson P.C.

(57) ABSTRACT

The invention relates to a method for processing a substrate with a focussed particle beam which incidents on the substrate, the method comprising the steps of: (a) generating at least one reference mark on the substrate using the focused particle beam and at least one processing gas, (b) determining a reference position of the at least one reference mark, (c) processing the substrate using the reference position of the reference mark, and (d) removing the at least one reference mark from the substrate.

33 Claims, 14 Drawing Sheets

(56) References Cited

U.S. PATENT DOCUMENTS

| | | | |
|---|---|---|---|
| 2005/0072753 A1* | 4/2005 | Koops et al. | 216/2 |
| 2006/0138356 A1 | 6/2006 | Ichikawa et al. | |
| 2006/0148666 A1* | 7/2006 | Peters | C11D 1/04 510/175 |
| 2007/0023689 A1 | 2/2007 | Iizuka et al. | |
| 2008/0073580 A1 | 3/2008 | Phaneuf et al. | |
| 2008/0314871 A1 | 12/2008 | Toth | |
| 2010/0092876 A1 | 4/2010 | Kanamitsu | |

FOREIGN PATENT DOCUMENTS

| | | | |
|---|---|---|---|
| JP | H07-122484 | 5/1995 | |
| JP | H10-090876 | 4/1998 | |
| JP | 2003-7247 | 1/2003 | H01J 37/28 |
| JP | 2004-251964 | 9/2004 | |
| JP | 2006-156179 | 6/2006 | |
| JP | 2006-350219 | 12/2006 | |
| JP | H11-330209 | 11/2009 | |
| JP | 2010-085778 | 4/2010 | |
| JP | 2010-85778 | 4/2010 | |

OTHER PUBLICATIONS

Wang (Journal of Vacuum Science & Technology B 22, 1803 (2004)).*

International Preliminary Report on Patentability for corresponding PCT Appl. No. PCT/EP2012/057621, dated Oct. 29, 2013.

Klaus Edinger et al., "Performance results from the Zeiss/NaWoTec MeRit MG electron beam mask repair tool," Proc. SPIE, vol. 5853, 2005, pp. 361-370, XP040206770.

Korean Office Action, with translation thereof, for KR Appl No. 10-2013-7031230, dated Feb. 24, 2015.

Japanese Office Action with English translation thereof for JP Appln. No. 2014-506858, dated Dec. 24, 2014, 10 pages.

Korean Office Action, with translation thereof, for KR Appl No. 10-2013-7031230, dated Jan. 14, 2016.

Japanese Office Action, with translation thereof, for JP Appl No. 2014-506858, dated Sep. 30, 2015.

Taiwanese Office Action and English translation thereof for corresponding TW Appl. No. 101114408, dated Jan. 23, 2017, 10 pages.

* cited by examiner

Fig. 1
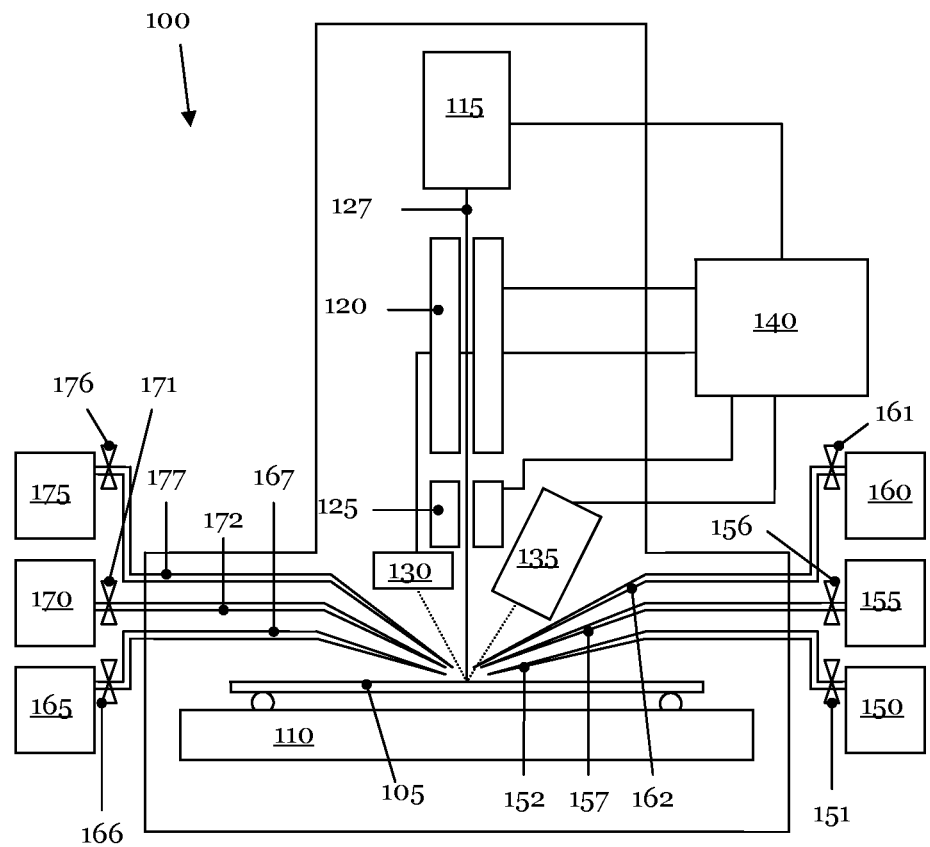
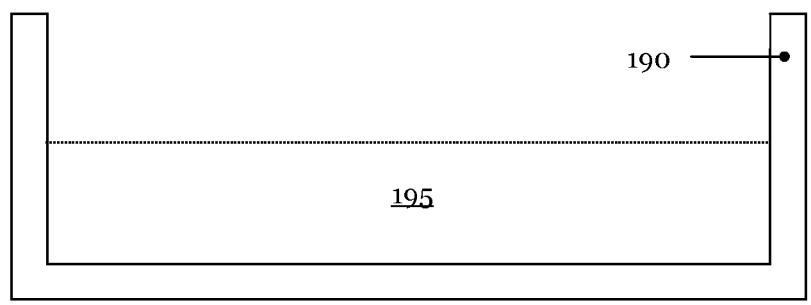

under 35 U.S.C. §119, this application claims the benefit
METHOD AND APPARATUS FOR PROCESSING A SUBSTRATE WITH A FOCUSED PARTICLE BEAM

CROSS REFERENCE TO RELATED APPLICATIONS

Under 35 U.S.C. §119, this application claims the benefit of U.S. provisional application 61/479,018, filed Apr. 26, 2011, which is incorporated in its entirety herein by reference.

FIELD OF THE INVENTION

The present invention relates to the field of processing a substrate with a focussed particle beam.

BACKGROUND OF THE INVENTION

As a result of the steadily increasing integration density of semiconductor devices, photolithographic masks or templates for nanoimprint lithography have to transfer smaller and smaller features. To meet this demand, the actinic wavelength of the imaging tool has been reduced in steps of 436 nm and 365 nm to 193 nm. Furthermore, immersion lithography has been introduced to enlarge the numerical aperture of the projection systems. As a consequence, the mask manufacturing process has reached a very high degree of complexity accompanied with strongly enlarged costs. In the near future, reflective masks will be used for imaging using light of a wavelength of 13.5 nm.

In order to manufacture photolithographic masks with a sufficient yield, mask defects are removed by repairing at the end of the manufacturing process. The generation of structure elements on the wafer illuminated with the photolithographic mask may also lead to small defects which have also to be corrected. Moreover, ultralarge-scale (ULSI) chips often have a multitude of integrated circuit variants on the same chip which are selected, activated and repaired by circuit editing. In addition, the advances of the microlithography technique allow the fabrication of for example micro-electro-mechanical systems (MEMS) or photonic integrated circuits (PIC) having smaller and smaller feature sizes whose fabrication is an error-prone process. Similar to the situation of the photolithographic masks, it is necessary to correct the errors of these devices whenever possible.

In the following these items and further ones are summarized with the term substrate.

Typically, the above mentioned errors are local defects which can be corrected by using a focussed particle beam. The focussed particle beam provides the spatial resolution (<1 µm) required for the above mentioned small structures. In order to repair local defects on a substrate a suitable processing gas is applied in combination with the particle beam in order to induce particle beam assisted chemical processes. For locally removing excessive material of a substrate, the processing gas comprises at least one etching gas. In case of locally depositing a certain material, a precursor gas or a chemical vapour deposition (CVD) gas is used as processing gas.

During the processing of a defect, the defect may heat up. Further, the micromanipulators used for scanning may acquire some slip within a certain time period. Furthermore, when using a charged particle beam, the substrate surface may charge up, and thus leading to shifts and/or distortions of the position where the charged particle beam hits the substrate. All these effects lead to a drift of the relative position between the incident particle beam and the substrate to be processed which deteriorates the spatial resolution of the particle beam with respect to the defective area of the substrate.

This problem can be solved by using and/or fabricating and using a reference mark close to the defect on the substrate. In some embodiments, the reference mark has dimensions in the range of 50 nm to 100 nm. During the repairing process, the reference mark is used to correct the drift of the particle beam with respect of the defective area. In the prior art, such a process is called drift correction (DC).

The following documents should be noted as prior art for the present patent application: U.S. Pat. No. 7,018,683, EP 1 662 538 A2, JP 2003007247 A, US 2007/0023689, and US 2008/0073580.

However, a new situation occurs if the size of feature elements is reduced to such an extent that their dimensions become comparable with the dimensions of the reference mark(s). Then, the reference mark(s) can no longer be ignored as they can influence the further processing of the substrate and there is a danger that the reference mark(s) can have an effect on an image of the substrate.

It is therefore one object of the present invention to provide a method and an apparatus for minimizing the effect of a reference mark on the further processing and/or on the application of the substrate.

SUMMARY OF THE INVENTION

According to a first aspect of the invention, a method of processing a substrate with a focussed particle beam, which impinges on the substrate, comprises the steps of: (a) generating at least one reference mark on the substrate using the focused particle beam and at least one processing gas, (b) determining a reference position of the at least one reference mark, (c) processing the substrate using the reference position of the reference mark, and (d) removing the at least one reference mark from the substrate.

In an aspect, the processing of a substrate according to the claimed method generates in a first step a reference mark with a known composition. The reference mark assists in the error correction. The reference mark can be removed from the substrate using conventional processes.

In an embodiment, photolithographic masks of a 32 nm node have a typical line width of 130 nm, which is similar to the dimensions of DC marks (50 nm-100 nm). Thus, at the end of a successful repairing process the reference mark(s) may lead to undesired effects. Examples for such effects are detection of reference marks by metrology tools which may lead to difficulties at the final inspection of masks. A DC mark can be invisible in the transmitted light if it is located on an absorbing line, but it can be "seen" in the reflected or scattered light components of inspection tools. Moreover, with shrinking feature sizes residuals from scanning the DC mark during repair might influence the transmission of the spaces and hence the printability even on 193 nm masks. Consequently, at the application of the photolithographic mask the reference marks may even result in exposure losses impairing the quality of the image generated by the mask on a wafer.

Moreover, the composition of the reference marks is often not very well known. In fact, it is even difficult to define their composition. For example, there might be inhomogeneities of the density and/or in atomic ratios. Therefore, it is difficult to predict their temporal evolution during the further processing of the masks and especially during their application. In particular, the exposure of reference marks to ultraviolet or deep ultraviolet (DUV) radiation used in the projection system of lithography devices may challenge the long term stability of reference marks.

The application of the defined defect correction process avoids the above discussed problems.

Furthermore, the method described above is not limited to mask repairing processes. It can be applied to any kind of processing where auxiliary structures have to be arranged on samples which are needed for the processing of the samples and which have to be removed from the samples at the end of the processing.

In one aspect, determining the reference position occurs prior to processing the substrate.

When the reference position of a reference mark is determined before starting the processing of the substrate, the effects of all processing steps on the relative position of the particle beam and the processing position on the substrate can be tracked and corrected.

In a further aspect, processing of the substrate further comprises: (a) interrupting processing, (b) determining a drift of a position of the at least one reference mark with respect to the reference position, and (c) continuing processing of the substrate with the corrected drift. In still another aspect, processing of the substrate further comprises periodically repeating steps (a) to (c).

The period of the determination of the drift of the position of a reference mark can be adjusted to the specific situation of the processing. For example, a shorter time period can be selected at the beginning of the process when the overall apparatus has not yet reached a thermally stable condition. Furthermore, the time period may depend on the actual processing of the substrate as for example locally removing material or locally depositing material on the substrate.

According to another aspect, processing of the substrate further comprises repeating steps (a) to (c) of the last but one paragraph based on a signal of a drift sensor.

The application of a drift sensor in addition to a reference mark provides a second independent means for determining the position of the focussed particle beam. Moreover, a drift sensor allows the determination of a sudden drift of the focussed particle beam within a time period. Between two points in time, the drift is detected from the images of the reference mark.

In another aspect, processing of the substrate further comprises using a particle beam different from the particle beam used for generating the at least one reference mark.

Depending of the specific substrate and its composition, it is possible to use one particle beam for the generation of the reference mask and another one for the processing of the substrate.

In a further aspect, the processing gas comprises at least one first precursor gas, at least one second precursor gas and/or at least one etching gas. The second precursor gas can differ from the first precursor gas.

According to another aspect, generating at least one reference mark comprises depositing a dot of material using the focussed particle beam and the at least one first precursor gas.

Although it is conceivable to apply one processing gas for the generation of the reference mark and for the processing of the substrate, it is much more likely to use a specific first precursor gas or a combination of several specific precursor gases for the generation of the reference mark. If the processing of the substrate comprises the local deposition of a specific material on the substrate, a second precursor gas is typically used. In case, the processing of the substrate comprises locally removing material, a single etching gas or a combination of several etching gases can be used.

According to a further aspect, generating at least one reference mark comprises etching a hole using the focussed particle beam and the at least one etching gas.

Generally, the reference mark has the function to generate a contrast at a certain position of the substrate in an image of the area containing the reference mark. This contrast can be generated by a dot of material added to this position or by a small hole etched into the substrate at the respective position.

In another aspect, removing the at least one reference mark comprises using a conventional substrate processing process. In a further aspect, removing the at least one reference mark comprises filling the hole using of a conventional chemical vapour deposition process.

It is an important advantage of the present invention that the removal of the reference mark can be based on well-known technologies. Thus, the method described above can be applied without expensive and involved modifications of conventional particle beam generating apparatuses.

According to still another aspect, the focussed particle beam comprises at least one of an electron beam, an ion beam, an atom beam, a molecular beam, and/or a photon beam.

For inducing a particle beam assisted deposition or etching process one or more of the above mentioned particle beams can be utilized. As the listed particle beams can also locally release particles from the substrate, these beams can also be used for the determination of the reference position as well as of the actual position of the reference mark on the substrate.

In another aspect, the method comprises depositing a sacrificial layer on the substrate and generating at least one reference mark on the sacrificial layer.

The sacrificial layer can be deposited on the substrate with a large freedom with respect to parameters like composition, shape, position, thickness, etc. For example, the sacrificial layer can be deposited on the substrate by using the focussed particle beam in combination with at least one processing gas.

In a further aspect, the substrate comprises at least one of a transmissive or reflective photolithography mask, a nanoimprint lithography template, a semiconductor device, a micro-electromechanical device, a photonic integrated circuit, an integrated circuit, and/or a printed circuit board.

As already indicated, the method described above can be applied to every kind of processing of a sample or of a substrate where auxiliary structures have to be arranged on the sample or substrate which are needed for the processing of the sample or substrate and which have to be removed after finalization of the processing of the sample or substrate.

In still another aspect, the reference mark comprises a material: (a) generating a contrast difference with respect to the substrate material in the image generated with the focussed particle beam, (b) being robust during processing of the substrate, and (c) being removable from the substrate at the end of the processing using a conventional substrate processing process.

According to the first requirement, it is not preferred to use the substrate material as material for reference marks. Such a reference mark would not provide a material contrast, however the substrate material can still provide a topographic contrast difference. In the following, a multitude of first precursor gases is indicated leading to materials on the substrate having the required characteristics. By using a first precursor gas having a known composition and by performing the generation of the reference mark with well defined parameters for the growth conditions, the resulting reference mark also has a known composition.

A further aspect comprises generating a material contrast difference with respect to the substrate material in an image of the focussed particle beam.

For example, the material of the reference mark may reflect electrons stronger or lesser than the material surrounding the reference mark. It is possible to choose a reference mark material which results for a given substrate material in a reasonable material contrast difference. In another example, the material of the sacrificial layer and the material of the reference mark are selected so that reference mark generates a high material contrast difference relative to the sacrificial layer material.

In a further aspect, the at least one first precursor gas comprises at least one deposition gas or at least one deposition gas and at least one additive gas.

In another aspect, the at least one deposition gas comprises at least one of a metal alkyl, a transition element alkyl and a main group element alkyl. According to still a further aspect, the at least one of a metal alkyl, a transition element alkyl and a main group element alkyl comprises cyclopentadienyl (Cp) trimethylplatinum ($CpPtMe_3$), methylcyclopentadienyl (MeCp) trimethylplatinum ($MeCpPtMe_3$), tetramethyltin ($SnMe_4$), trimethylgallium ($GaMe_3$), ferrocene cyclopentadienyl ($Cp_2Fe$), and bis-aryl chromium ($Ar_2Cr$). In all these cases, the term "methyl" relates to the hydrocarbon radical —$CH_3$.

In a further aspect, the at least one deposition gas comprises at least one of a metal carbonyl, a transition element carbonyl and a main group element carbonyl. In another aspect, the at least one of a metal carbonyl, a transition element carbonyl and a main group element carbonyl comprises chromium hexacarbonyl ($Cr(CO)_6$), molybdenum hexacarbonyl ($Mo(CO)_6$), tungsten hexacarbonyl ($W(CO)_6$), dicobalt octocarbonyl ($Co_2(CO)_8$), triruthenium dodecarbonyl ($Ru_3(CO)_{12}$), and iron pentacarbonyl ($Fe(CO)_5$).

According to another aspect, the at least one deposition gas comprises at least one of a metal alkoxide, a transition element alkoxide and a main group element alkoxide. In still a further aspect, the at least one of a metal alkoxide, a transition element alkoxide and a main group element alkoxide comprises tetraethyl orthosilicate ($Si(OC_2H_5)_4$) and titanium isopropoxide ($Ti(OCH(CH_3)_2)_4$).

In still an alternative aspect, the at least one deposition gas comprises at least one of a metal halogenide, a transition element halogenide and a main group element halogenide. According to another aspect, the at least one of a metal halogenide, a transition element halogenide and a main group element halogenide comprises tungsten hexachloride ($WCl_6$), titanium tetrachloride ($TiCl_4$), boron trichloride ($BCl_3$), and silicon tetrachloride ($SiGl_4$).

According to another aspect, the at least one deposition gas comprises at least one of a metal complex, a transition element complex and a main group element complex. In a further aspect, the at least one of a metal complex, a transition element complex and a main group element complex comprises copper hexafluoroacetylacetonate (Cu $(C_5F_6HO_2)_2$) and dimethyl gold trifluoroacetylacetonate ($Me_2Au(C_5F_3H_4O_2)$).

In a yet a further aspect, the at least one deposition gas comprises carbon monoxide (CO), carbon dioxide ($CO_2$), aliphatic or aromatic hydrocarbons, constituents of vacuum pump oil, and volatile organic compounds. The constituents of vacuum pump oil comprise so-called silicone compounds, containing for instance —$Si(Me)_2$— or —$Si(OMe)_2$— moieties. In contrast to this, the prior art uses for example: simple aromatic compounds such as acetylene, benzene, naphthalene or anthracene, fragrances such as menthol or camphor, organic solvents such as acetone, isopropanol or acetic acid, and monomers such as acrylic acid and styrene.

A further aspect, the at least one additive gas comprises oxidizing agents. In still a further aspect, oxidizing agents comprise oxygen ($O_2$), ozone ($O_3$), water vapour ($H_2O$), hydrogen peroxide ($H_2O_2$), nitrous oxide ($N_2O$), nitrogen oxide (NO), nitrogen dioxide ($NO_2$), nitric acid ($HNO_3$), and oxygen containing gases.

In yet another aspect, the at least one additive gas comprises halogenides. In another aspect, halogenides comprise chlorine gas ($Cl_2$), hydrochloric acid (HCl), xenon difluoride ($XeF_2$), hydrofluoric acid (HF), iodine ($I_2$), hydrogen iodide (HI), bromine ($Br_2$), hydrogen bromide (HBr), nitrosyl oxide chloride (NOCl), phosphorus trichloride ($PCl_3$), phosphorus pentachloride ($PCl_5$), phosphorus trifluoride ($PF_3$), nitrogen trifluoride ($NF_3$), and halogen containing gases.

According to still a further aspect, the at least one additive gas comprises gases having a reducing effect. In another aspect, gases having a reducing effect comprise hydrogen ($H_2$), ammonia ($NH_3$), methane ($CH_4$), and hydrogen containing gases.

In another aspect, removing the reference mark is carried out in the vacuum chamber used for depositing the reference mark.

By removing the reference mark in the vacuum chamber used for generating the reference mark and also used for processing the substrate, the set-up time for the overall process is reduced to a minimum, hence resulting in an efficient overall process.

In a further aspect, removing the reference mark comprises directing the particle beam and at least one etching gas onto the reference mark. According to a beneficial aspect, the particle beam comprises an electron beam and the at least one etching gas comprises at least one halogen containing gas. In another aspect, removing the reference mark is carried out in a cleaning device using a conventional cleaning process.

In contrast to a heavy particle beam, such as an ion beam, an electron beam does not introduce serious damage to the substrate, thus enabling an essentially residue-free processing of the substrate.

According to another aspect removing the sacrificial layer is carried out in a cleaning device using a conventional cleaning process, the cleaning process simultaneously removes the at least one reference mark on the sacrificial layer.

During the cleaning process all reference marks arranged on the sacrificial layer are removed, even if their etching rate in the cleaning process is smaller than that of the sacrificial layer itself. Therefore, the application of a sacrificial layer can be beneficial in situations where reference marks are required which have to withstand a multitude of repairing process steps.

In a further aspect, removing the reference mark is carried out in a cleaning device using a conventional cleaning process. In yet another aspect, cleaning comprises a wet chemical cleaning process.

In one embodiment of the invention, the removal of the reference mark is not performed in a local process in the vacuum chamber, but in a cleaning device in combination with the final cleaning of the substrate. Cleaning processes are well established in the semiconductor industry and in the related fields. In a cleaning device, the cleaning agent can be designed to the material of the respective reference mark. By a wet chemical cleaning process, all reference marks arranged on the overall substrate can be removed in a single step, hence resulting in a fast cleaning process.

In one aspect, filling the hole comprises using of an electron beam and at least one of the at least one first precursor gas and/or of the at least one second precursor gas.

The filling of a hole, which was used as a reference mark, using a focussed particle beam and a precursor gas is very similar to repairing a local defect on the substrate by depositing material on the substrate. Thus, the filing of the hole which temporarily forms the reference mark can be performed with minimum experimental effort.

In a further aspect of the invention, a method for removing excessive material from a substrate comprises (a) depositing a removable material around the excessive material using a focussed particle beam and at least one deposition gas, and (b) removing the excessive material together with the removable material.

The benefit of this aspect of the invention is that excessive material which can typically not be deleted in a cleaning process can be removed. By surrounding excessive material with a material which can be easily removed, as for example in a cleaning process, the excessive material and the removable material are jointly removed.

This aspect of the invention can be used to remove excessive material from the substrate which is already present at the beginning of the substrate repairing process. Moreover, it can be applied to remove excessive material unintentionally deposited during a substrate repairing process.

In a further aspect, the excessive material comprises material unintentionally deposited during a drift correction process. According to another aspect, depositing of the removable material around the excessive material is performed before starting a repairing process of the substrate. In still another aspect, the removable material comprises material used for generating a reference mark. In a further aspect, the removable material comprises a combination of elements molybdenum, carbon and oxygen and/or a combination of elements molybdenum and oxygen.

In still a further aspect, removing the excessive material and the removable material comprises directing a focussed particle beam and at least one etching gas onto the area comprising the excessive material and the removable material. According to another aspect, removing the excessive material and the removable material is carried out in a cleaning device using a conventional cleaning process. In a beneficial aspect, removing the excessive material and the removable material comprises using of a chemical removal process.

Furthermore, according to a further aspect of the invention, an apparatus of processing a substrate with a focussed particle beam which incidents on the substrate comprises: (a) means for generating at least one reference mark on the substrate using the focused particle beam and at least one processing gas, (b) means for determining a reference position of the at least one reference mark, (c) means for processing the substrate using the reference position of the reference mark, and (d) means for removing the at least one reference mark from the substrate.

In still another aspect, the focussed particle beam comprises at least one of an electron beam, an ion beam, an atom beam, a molecular beam, and/or a photon beam.

In an aspect, the substrate comprises at least one of a transmissive or reflective photolithography mask, a nanoimprint lithography template, a semiconductor device, a microelectromechanical device, a photonic integrated circuit, an integrated circuit, and/or a printed circuit board.

In another aspect, the processing gas comprises at least one first precursor gas, at least one second precursor gas and/or at least one etching gas. In a further aspect, the at least one first precursor gas comprises at least one deposition gas or at least one deposition gas and at least one additive gas. According to a further aspect, wherein the at least one deposition gas comprises at least one of the deposition gases given above.

Moreover, in still another aspect of the invention, an apparatus of processing a substrate comprises: (a) a particle source for generating a particle beam and at least one imaging element for focussing and directing the particle beam onto the substrate, (b) at least one storage container for storing at least one first precursor gas and a conduit with a valve for directing and dosing the at least one precursor gas onto the substrate, wherein the particle beam and the at least one first precursor gas generate at least one reference mark on the substrate, (c) at least one detector for determining a reference position of the at least one reference mark, (d) at least one storage container for storing at least one second precursor gas and a conduit with a valve for directing and dosing the at least one second precursor gas onto the substrate, wherein the particle beam and the at least one second precursor gas locally deposit material on the substrate, (e) at least one storage container for storing at least one etching gas and a conduit with a valve for directing and dosing the at least one etching gas onto the substrate, wherein the particle beam and the at least one etching gas locally remove material from the substrate, and (f) wherein the particle beam and the at least one etching gas also remove the at least one reference mark from the substrate.

In a further aspect, the detector detects particles back scattered from the substrate and/or secondary electrons generated in the substrate under the effect of the particle beam.

In still another aspect, the at least one additive gas comprises at least one of the additive gases given above.

In yet a further aspect, the apparatus further comprises at least one storage container for storing at least one additive gas and a conduit with a valve for directing and dosing the at least one additive gas, wherein the at least one additive gas is used to generate at least one reference mark and/or to locally deposit material on the substrate during the processing of the substrate.

According to a further aspect, the apparatus further comprises at least one cleaning device to perform wet chemical cleaning.

Finally, in still another aspect, a mass flow controller and/or using a thermalized precursor gas is used to dose a vapour pressure of the first and/or the second precursor gas and/or the etching gas.

DESCRIPTION OF THE DRAWINGS

In order to better understand the present invention and to appreciate its practical applications, the following Figures are provided and referenced hereafter. It should be noted that the Figures are given as examples only and in no way limit the scope of the invention.

FIG. 1 schematically represents a block diagram of some of the major components of an apparatus used to generate a reference mark on a substrate, to process the substrate and to remove the reference mark after the processing of the substrate;

DETAILED DESCRIPTION OF THE PREFERRED EMBODIMENTS

Figure 2:
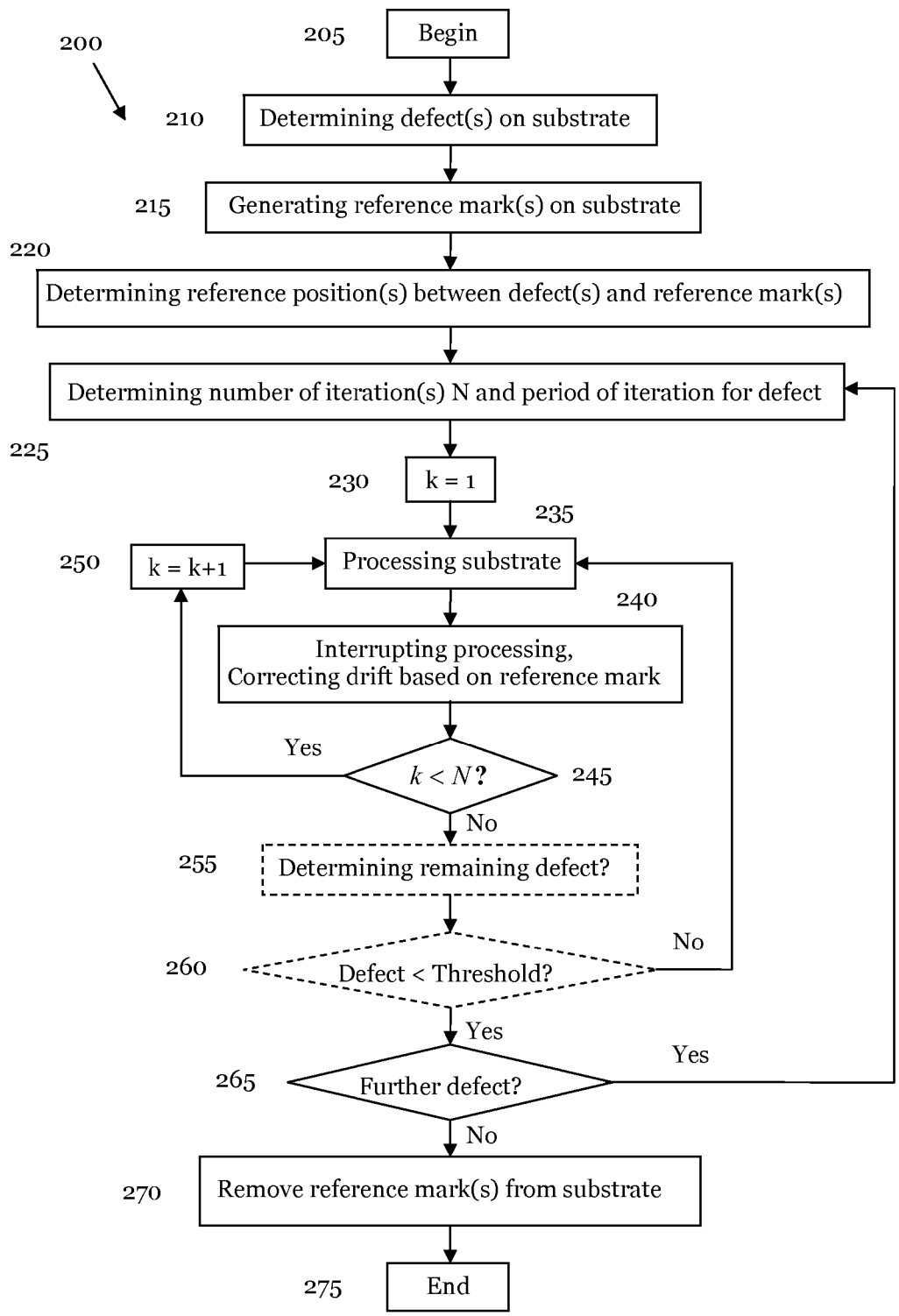
FIG. 2 presents a flow chart defining an exemplary embodiment of the claimed method.

In the following, the present invention will be described hereinafter in more details with reference to accompanying Figures, in which exemplary embodiments of the invention are illustrated. However, the present invention may be embodied in different forms and should not be construed as limited to the embodiments set forth herein. Rather, these embodiments are provided so that this disclosure will be thorough and will convey the scope of the invention to persons skilled in the art.

FIG. 1 shows a schematic diagram of essential components of an apparatus 100 which can be used to generate a reference mark on a substrate 105, to process the substrate 105 and to remove the reference mark from the substrate 105 at the end of the processing of the substrate 105, or to be more specific when the error(s) on the substrate 105 are corrected. The exemplary apparatus 100 depicted in FIG. 1 is a modified scanning electron microscope (SEM). The electron gun 115 generates an electron beam 127 and the beam forming and imaging elements 120 and 125 direct the focussed electron beam 127 onto a substrate 105 which is arranged on a sample stage or substrate stage 110.

The sample stage no is an XY stage (not shown in FIG. 1) which can be moved to a defective region of the substrate 105. Furthermore, the sample stage no can comprise a temperature setting and controlling element (not indicated in FIG. 1) which allows establishing and holding the substrate 105 at a predetermined temperature.

The apparatus of FIG. 1 uses an electron beam 127. An electron beam can be focussed to a small focal spot (diameter <10 nm) and the electrons striking onto the surface of the substrate 105 do not induce much damage in the substrate 105 even when varying their kinetic energy across a large range. However, the method of the present invention is not limited to the application of an electron beam. In general, any particle beam can be utilized which is able to locally induce a chemical reaction of a processing gas provided at the location the particle beam incidents on the substrate 105. Examples of alternative particle beams are ion beams, atomic beams, molecular beams and/or photon beams. Further, it is possible to use two or several particle beams in parallel. In particular, it is possible to simultaneously apply an electron beam or an ion beam in combination with a photon beam (not shown in FIG. 1).

The electron beam 127 can be applied to record an image of the substrate 105 by scanning the substrate surface. A detector 130 for back-scattered and/or secondary electrons generated by the incident electron beam 127 provides a signal proportional the surface contour and/or to the composition of the substrate 105.

A computer system 140 can calculate an image of the substrate 105 from the signal of the detector 130 when the electron beam 127 is scanned across the substrate surface. The computer system 140 may contain algorithms, realized in hardware and/or software, which allow extracting an image from the signal data of the detector 130. A monitor of the computer system 140 (not shown in FIG. 1) can display the calculated image. Furthermore, the computer system 140 can store the signal data of the detector 130 and/or the calculated image. Further, the computer system 140 can also control the electron gun 115 and the beam forming and imaging elements 120 and 125. Control signals of the computer system 140 may further control the movement of the sample stage 110 (not illustrated in FIG. 1).

The electron beam 127 incident on the substrate 105 can charge up the substrate surface. This can occur if the substrate 105 is an isolator or has an isolating coating. Furthermore, this may also occur on conductive substrates if they are electrically floating, i.e. not connected to an earth potential. As a further complication, complex space charge distributions might be generated in the substrate material depending on the primary electron energy. This can result in the co-existence of charged areas in the substrate which have different polarities. Temporal effects due to discharging of areas of different capacity and conductance lead to unpredictable positioning errors of the primary focussed electron beam 127.

Consequently, a positive or a negative charge accumulated on the substrate 105 reduces the spatial resolution of the electron beam 127, and thus the resolution of the generated surface image. In order to reduce the effect of the charge accumulation, the ion gun 135 may be used to irradiate the substrate surface with ions having low kinetic energy. For example, an argon ion beam having a kinetic energy of a few hundred Volt can be applied to neutralize the substrate surface.

When using a focused ion beam (FIB) instead of an electron beam, a positive charge distribution accumulates on an isolating surface of the substrate 105. In this case, an electron beam irradiating the substrate surface can be used to reduce the positive charge distribution on the substrate surface. The computer system 140 can also control the ion beam source 135.

In order to process the substrate 105 on the sample stage 110, apparatus 100 of FIG. 1 has three storage containers for three different processing gases. The first storage container 150 stores a first precursor gas or a deposition gas which can in combination with the electron beam 127 generate a reference mark on the surface of the substrate 105 as will be described in detail when discussing FIG. 4 below. The second container 155 provides a second precursor gas which can be used to repair or correct a defect which is characterized in that specific material is locally missing on the substrate 105. The third storage container 160 stores an etching gas which can be utilized to locally remove excessive material from the surface of the substrate 105.

The fourth storage container 165 provides an additive gas which can be used in combination with the first precursor gas or the deposition gas stored in the first container 160. Similar, the fifth storage container 170 contains another precursor gas which can be applied together with the second precursor gas stored in the second container 155. Finally, the sixth storage container 175 provides a second etching gas which is applicable in combination with the etching gas in the third storage container 160.

Each storage container 150, 155, 160, 165, 170 and 175 has its own valve 151, 156, 161, 166, 171, 176 in order to control the amount of gas to be provided per time unit at the position of the incident electron beam 127. Furthermore, in FIG. 1, each container 150, 155, 160, 165, 170 and 175 has its own conduit 152, 157, 162, 167, 1722 and 177 ending in a nozzle close to the position where the electron beam 127 incidents on the substrate 105. In FIG. 1, the valves 151, 156, 161, 166, 171, and 176 are close to the respective container 150, 155, 160, 165, 170 and 175; in an alternative arrangement the valves 151, 156, 161, 166, 171, and 176 may be arranged close to the respective nozzle (not shown in FIG. 1). Moreover, in contrast to FIG. 1, the gases of two or more containers can be provided which a single conduit (also not illustrated in FIG. 1). Moreover, different to the illustration in FIG. 1 and presently not preferred, it is also possible to just provide one or several of the processing gas in the overall lower part of the apparatus 100. In this case, it is necessary that the apparatus 100 has an aperture (not indicated in FIG. 1) between the upper portion providing the focussed electron beam 127 and the lower portion comprising the processing chamber in order to prevent a too low vacuum in the upper portion of the apparatus 100.

Each of the storage containers 150, 155, 160, 165, 170 and 175 may have its own temperature setting and controlling element enabling both cooling and heating. This allows the storage of each processing gas at its optimal storage temperature (not shown in FIG. 1). In addition, each conduit 152, 157, 162, 167, 172 and 177 can also have a temperature setting and controlling element in order to provide each processing gas with its optimal processing temperature at the position on the substrate 105 where the electron beam 127 impacts (also not indicated in FIG. 1).

The apparatus of FIG. 1 has a pumping system to generate and to maintain the required vacuum. The pumping system can have separate pumping systems for the upper portion of apparatus 100 providing the electron beam 127 and the lower portion containing the sample stage no with the substrate 105. This is particularly useful, in case the apparatus 100 has an aperture between the upper and lower portions as explained above. Further, in order to secure a well-defined pressure condition close to the processing position, and thus defined processing conditions on the substrate 105, the apparatus 100 of FIG. 1 can also have an extraction device close to the processing position. The application of an extra extraction device can to a large extent avoid that components of the precursor gas which are not used to locally deposit specific material on the substrate 105, deposit somewhere else on the substrate or an the vacuum chamber of the apparatus 100. Furthermore, the extraction device can prevent that particles etched from the substrate 105 can distribute within the vacuum chamber. None of the vacuum generating and maintaining components is illustrated in FIG. 1.

The lower part of FIG. 1 shows a cleaning device 190 with a cleaning liquid 195 which is used to clean the substrate 105 during and/or after its processing in the apparatus 100 is finalized. Moreover, as will be explaining in detail during the discussion of FIG. 14, the cleaning device can also be applied in order to remove the reference mark(s) from the substrate 105.

FIG. 2 depicts a flow diagram 200 illustrating the error correction process of defects on the substrate 105. The process starts at steps 205. Then, in a first step 210, the errors or defects of a substrate 105 are determined. The substrate 105 may be any component having one or several local defect(s). Examples of substrate 105 are wafers, integrated circuits (ICs), micro-electromechanical systems (MEMSs), photonic integrated circuits (PICs) and/or transmissive and/or reflective photolithographic masks. In the following, the claimed principle is discussed in the context of a binary or phase shift photolithographic mask.

Figure 3:
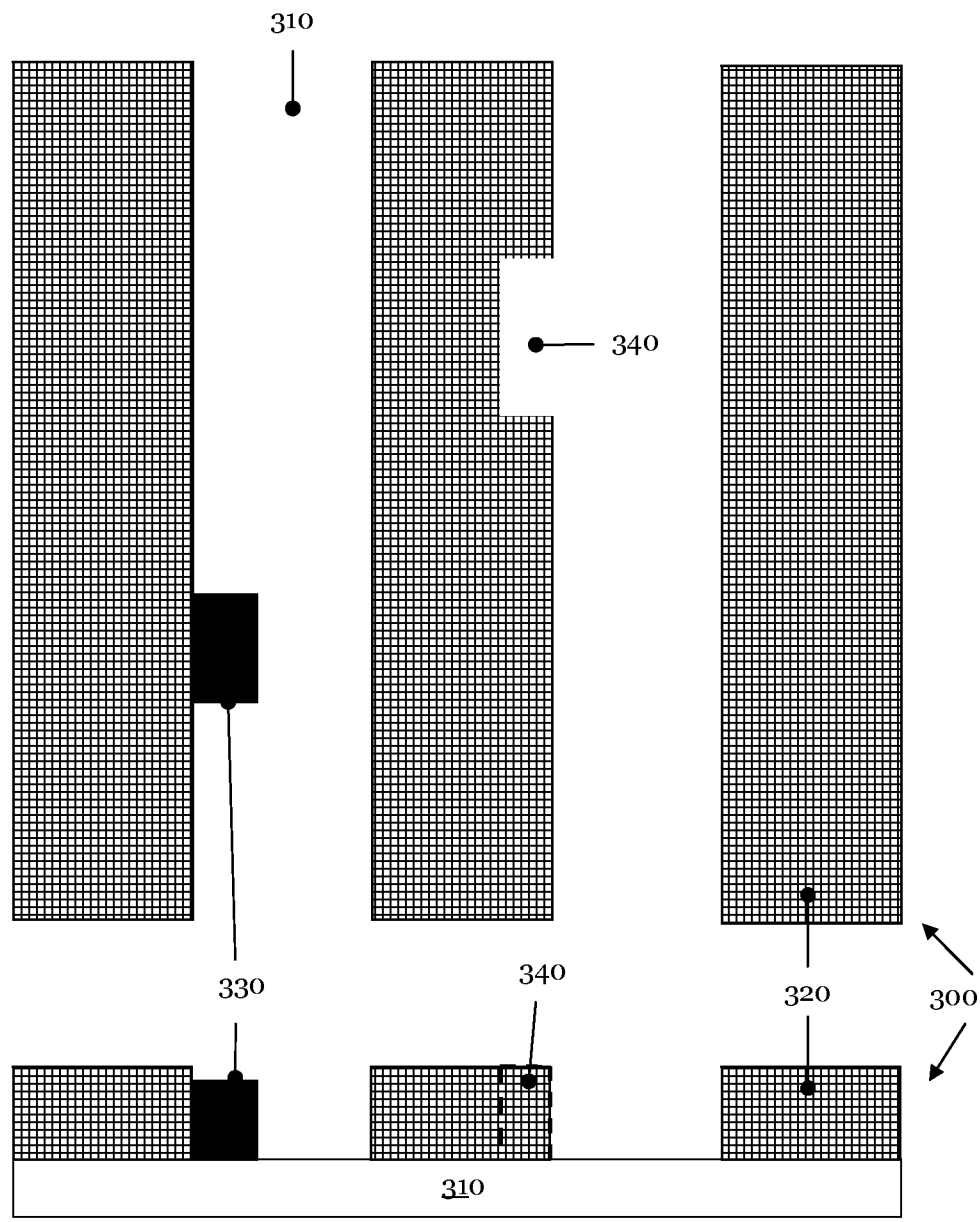
FIG. 3 schematically depicts a cut-out of a binary or phase shift photolithographic mask having a black or opaque defect and a blank or a clear defect.

FIG. 3 shows a cut-out of a phase shift mask 300. The upper part of FIG. 3 shows a top view on mask 300. The lower part illustrates a side view of mask 300. The photolithographic mask 300 comprises a transparent substrate 310, which is regularly a fused silica substrate. A black or opaque pattern 320 is arranged on the substrate 310. The pattern material often comprises chromium, but aluminium or tungsten can also be used. Chromium is typically used for binary masks. Phase shift masks mostly employ alloys made of molybdenum and silicon. Absorber structures on extreme ultraviolet (EUV) photolithography masks comprise tantalum compounds. All absorber materials contain additional elements like oxygen and/or nitrogen. Moreover, the composition may vary within the thickness of the absorber layer.

In FIG. 3, the feature element comprises three stripes. FIG. 3 also indicates that a black or an opaque defect 330 is arranged on the left opaque stripe. As can be seen from the side view, in this example, the opaque defect 330 has nearly the same height as the pattern elements 320. Furthermore, the middle stripe of FIG. 3 has a blank or a clear defect 340 as material is completely missing at a portion of the stripe. It is also possible that locally a stripe or a feature element 320 does not have a predetermined height.

As already mentioned, first step 210 of the flow diagram 200 of FIG. 2 comprises the determination of the location of the defects 330 and 340 of FIG. 3. This can be done by scanning the electron beam 127 across the defective areas 330 and 340 and measuring the backscattered and/or generated secondary electrons with the detector 130. In order to reduce the charge accumulation effect when scanning the opaque defect 330 and in particular the clear defect 340, the ion beam source 135 can be used not to impair the determination of the location of the defects 330 and 340.

If an FIB is applied instead of the electron beam 127, beside the detector 130, a secondary ion mass spectrometer (SIMS) can be used in addition to the electron detector 130.

Figure 4:
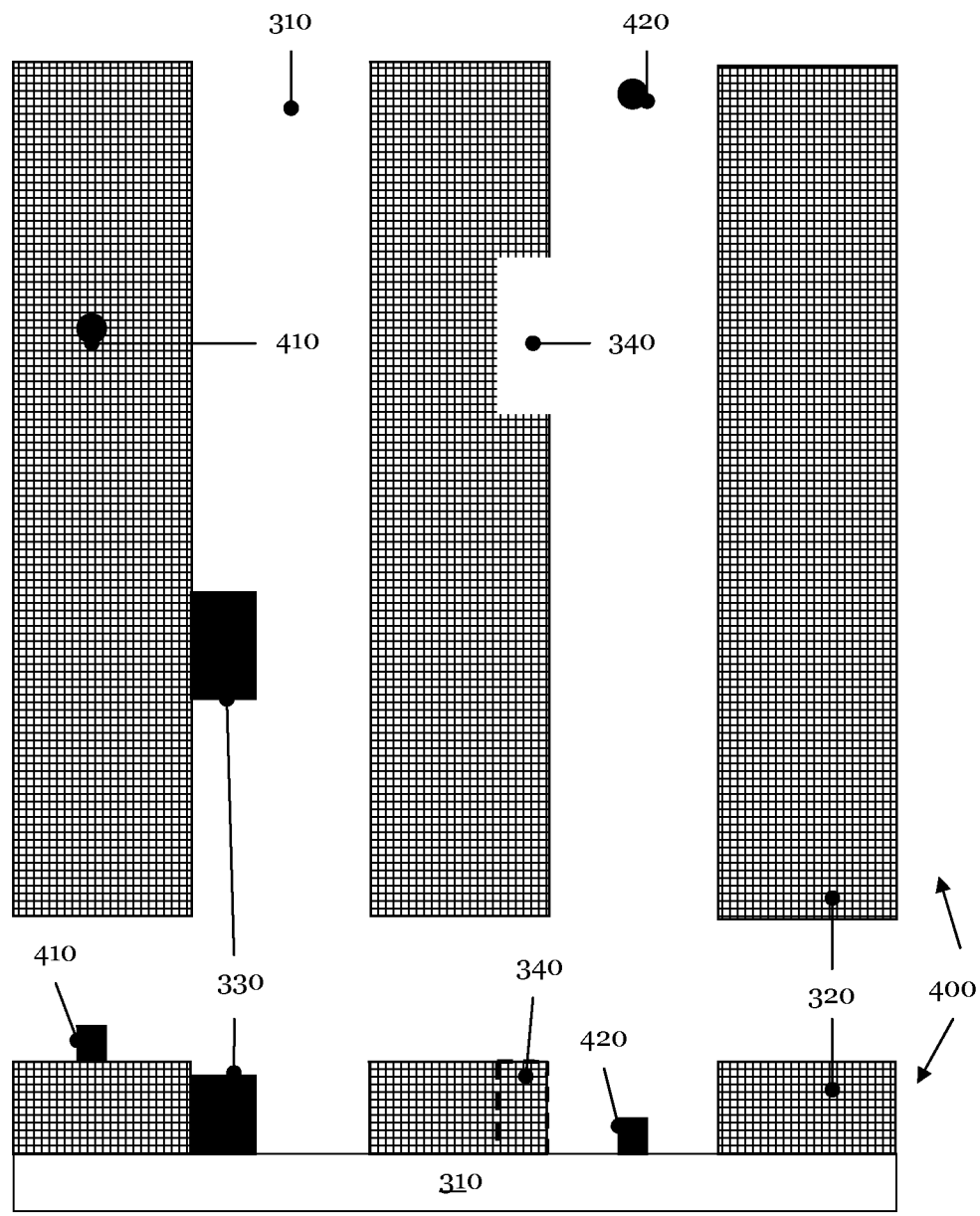
FIG. 4 schematically represents FIG. 3 after a reference mark has been generated for each defect.

The next step, step 215, in the flow chart 200 of FIG. 2 comprises the generation of reference mark(s). There are the several alternatives for the generation of reference mark(s) for the two defects 330, 340 illustrated in FIG. 3. FIG. 4 shows the configuration 400 where a first reference mark or DC mark 410 is provided for the opaque defect 310 on the left opaque stripe of feature element 320. A second reference mark 420 for the clear defect 340 is generated on the transparent substrate 310 of the photolithographic mask 300.

Alternatively, a single reference mark can also be used for both defects 330 and 340 as the two defects 330 and 340 are close to each other in the exemplary mask 300 of FIG. 3. Further, several reference marks could also be used for a single defect 330 and/or 340.

The application of a reference mark 410, 420 is based on the assumption that DC mark 410, 420 experiences the same shift or distortion influencing the electron beam 127 when impacting or scanning the defect 330, 340. Thus, it is beneficial to place the reference mark 410, 420 as close as possible to the respective defect 330, 430. On the other hand, processing of the defect 330, 340 can influence the reference mark 410, 420. For example, the processing of the defect 330, 340 may impair the visibility of the DC marks 410, 420 in the image obtained from the signal of the detector 130 by reducing the contrast between the DC mark 410, 420 and its environment.

The reference mark 410, 420 can be generated by using a fixed electron beam 127 and a first precursor gas stored in the container 150. The first precursor gas can be the deposition gas stored in the container 150. The deposition gas used for the generation of the DC marks 410 and 420 can for example be an alkyl, a carbonyl, an alkoxide, and or a halogenide of a metal, of a transition element, and or a main group element. The container 150 may also contain a mixture of several deposition gases. Presently, molybdenum hexacarbonyl ($Mo(CO)_6$) is a preferred deposition gas for a reference mark 410, 420.

A reference mark 410, 420 comprising molybdenum (Mo), carbon (C) and oxygen (O) as major components provides in an SEM (scanning electron microscope) image a topology contrast as well as a material contrast on both, the substrate 310 and the feature elements 320 of the photolithographic mask 300. The combination of both effects facilitates the identification of DC marks 410, 420. As an example, in the absence of an oxidizing agent reference marks having a ratio between the elements can be used: $Mo_{10\%-15\%}C_{70\%-75\%}O_{15\%}$. Using an efficient oxidation agent, reference marks comprise essentially $MoO_3$, which indicates that there is always at least as much carbon or oxygen as molybdenum in the deposited exemplary reference marks.

The energy of the electron beam 127 locally decomposes the deposition gas, so that the metal, the transition element and/or the main group element deposits on the substrate 310 or on the pattern element 320 at the position where the electron beam 127 hits the substrate surface. As discussed during the presentation of apparatus 100 of FIG. 1, a suction nozzle or an evacuation device arranged close to the processing position can evacuate the volatile components of the deposition gas, thus minimizing their assembly in reference marks 410 and 420.

In addition to the deposition gas of container 150, an additive gas stored in the container 165 may be added to the deposition gas. Examples of additive gases are oxygen containing gases, halogenides and halogen containing gases and/or gases having a reducing effect. In a further embodiment, the container 165 comprises a mixture of two or several additive gases.

The apparatus 100 of FIG. 1 enables a precise control of the parameter determining the growth conditions of the DC mark material. Therefore, the composition as well as of the dimensions of the reference marks 410 and 420 can be controlled.

An electron beam 127, which perpendicularly incidents on the substrate 105, produces essentially a round reference mark 410, 420. Depending on the deposition parameters, the diameter of the generated DC mark is in the range between 50 nm and 100 nm. Smaller marks do not provide enough contrast in the respective image, and larger marks or pads may interfere with the further processing of the substrate or with the application of the fabricated substrate. The term essentially means here as well as on other positions within this specification the numerical value of a quantity within the uncertainty of measurement.

The electron beam 127 has typically a beam energy between 0.2 keV and 3 keV depending on the type of substrate onto which the reference is to be deposited. The primary electron beam 127 has a focal spot (full width half maximum (FWHM)) in the range of 1 nm to 5 nm and the beam current is between 10 pA and 250 pA. The time a reference mark is illuminated varies within the range of 0.1 s to 10 s. The chamber pressure during deposition in typically in the range of $1 \cdot 10^{-6}$ and $1 \cdot 10^{-6}$ mbar, and is measured by a Penning gauge which is situated far from the gas injection point.

The DC marks have typically a diameter of approximately 80 nm for a height of approximately 50 nm. As already indicated in the above example, the composition of the reference marks varies between $Mo_1C_{10}O_3$ and $MoO_3$, wherein the number indicate the stoichiometric ratio of the various elements.

With reference to the flow diagram 200 of FIG. 2, the relative position between the defect 330, 340 and the respective reference mark 410, 420 has to be determined (step 220 in FIG. 2). This measurement can again be performed by scanning the electron beam 127 across the photolithographic mask 300 without using a processing gas.

In step 225 of the flow chart 200 of FIG. 2, the parameters for the correction of the first defect 330 are determined. This analysis is based on data measured at the detection of the defect 330, or is obtained at the determination of the distance between defect 330 and DC mark 410. Depending on the defect, the etching gas stored in the container 160 is selected. A large number of etching gases for electron beam induced etching (EBIE) are already described in the prior art. Examples are halogenated gases, in particular xenon difluoride ($XeF_2$). Further, it is also decided whether it is useful to also use a second etching gas stored in the container 175. The second etching gas can also comprise a halogen, a halogenated gas and/or an oxidizing gas. The mixing ratio between the two etching gases provided from the containers 160 and 175 is also fixed.

Figure 5:
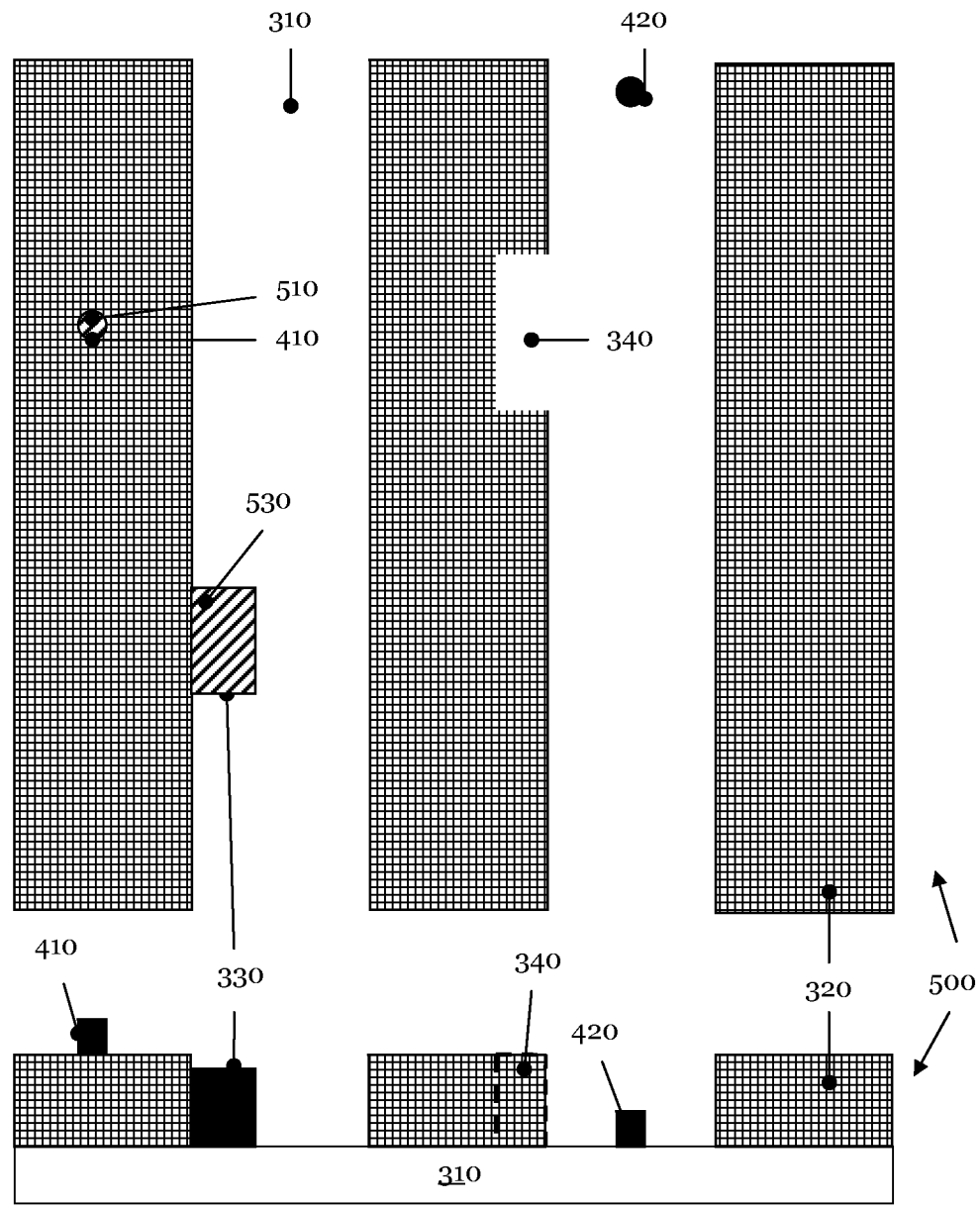
FIG. 5 schematically shows the begin of the processing of the black or opaque defect of FIG. 3.

Moreover, the parameters of the electron beam 127, dwell time, repetition time, beam energy and beam width are fixed. Then, the number of iterations and the time period for an individual iteration are determined as a function of the etching gas or the etching gas ratio and the electron beam parameters. FIG. 5 depicts the situation at the beginning of the correction process for the opaque defect 330. The electron beam 127 is adjusted so that it coincides with reference mark 410, illustrated by the reference numeral 510 in FIG. 5. Then, the sample stage 110 is moved by the determined distance between DC mark 410 and opaque defect 330.

Referring again to the flow chart 200 of FIG. 2, the first iteration (step 230) is started in step 235. To correct, i.e. to etch the opaque defect 330, the electron beam 127 is scanned across the defective area 530 using the above discussed parameters of the electron beam 127 the selected etching gas or a mixture of etching gases. The valve 161 at the container 160 storing the first etching gas is controlled to provide the required amount of etching gas at the position of the opaque defect 330. If required, the valve 176 controls the flow of the second etching gas contained in the storage container 175 to provide the desired mixture of etching gases. The ratio of the etching gas mixture can vary during the etching of the defect 330.

In step 240, when the first time period has elapsed, the etching of the opaque defect 330 is interrupted, i.e. the valve 161 at the container 160 storing the etching gas is closed. In case a mixture of etching gases is used to etch the defect 330, the valve 176 is also closed, interrupting the flow of the second etching gas.

Figure 6:
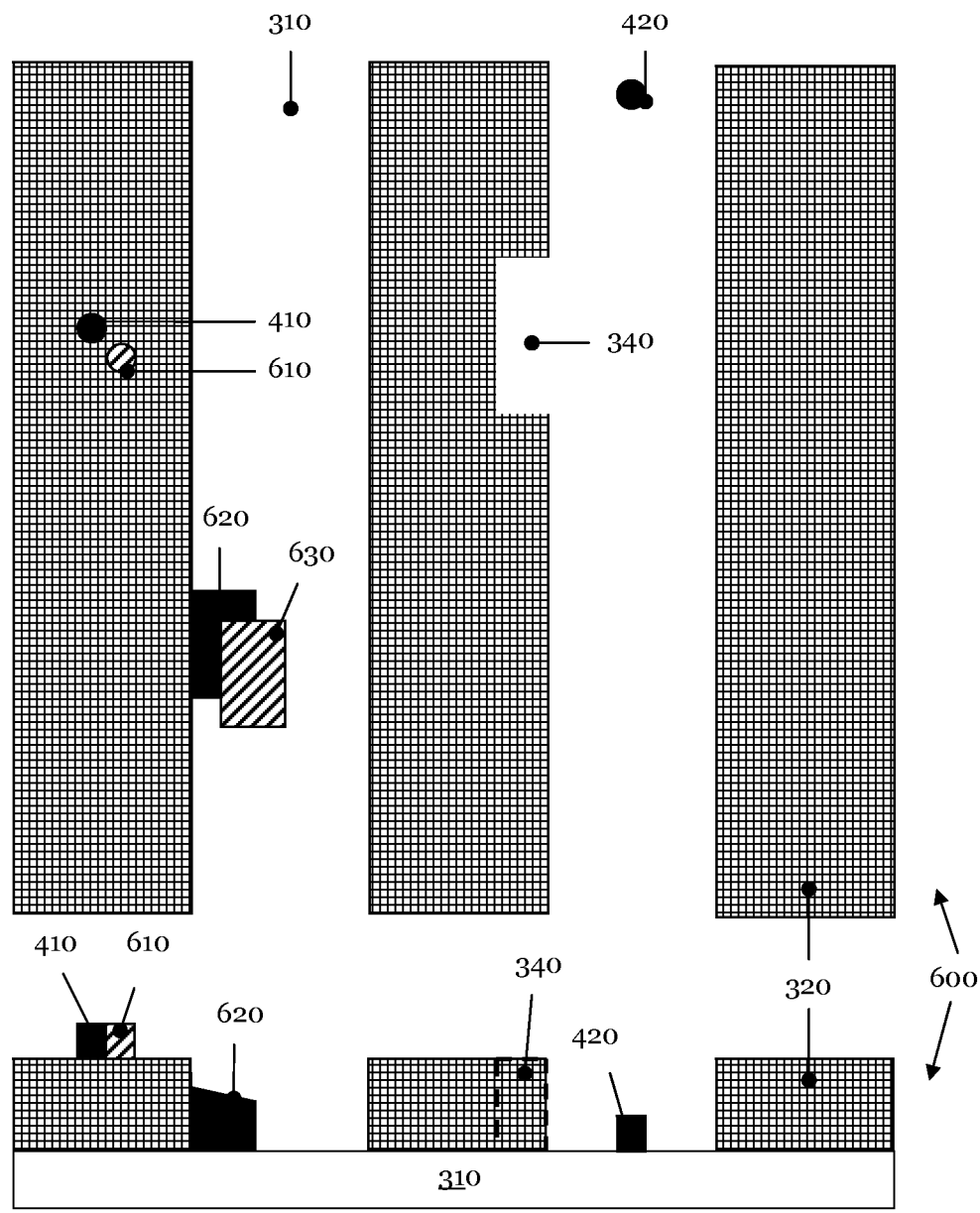
FIG. 6 schematically depicts the shift of the particle beam with respect to the opaque defect after a processing period of FIG. 5.

As indicated in the configuration 600 of FIG. 6, during the first processing time period, the area 630 scanned by the electron beam 127 has shifted relative to the area of the remaining defect 620. The area 630 is the area where etching is performed by the combined interaction of the electron beam 127 and the one or the several etching gases provided from the containers 160 and 175.

Several effects can cause a drift between the area 630 scanned by the electron beam 127 and the area of the defect 330. A temperature change within the substrate 310 of the mask 300 induced by the energy deposited by the electrons of the electron beam 127 cause an expansion of a portion of the mask substrate 310 shifting the defect 330 relative to the area 630 scanned by the electron beam 127. Further, the scan of the electron beam 127 can have a systematic error. The movement of the sample stage 110 may have a slip.

In addition or alternatively, the landing position of the electron beam 127 on the substrate 310 of the mask 300 can shift due to an accumulated charge on the surface of the mask substrate 310. As indicated in the side view of the lower part of FIG. 6, a layer has been etched from the defect 620, thus its height is reduced compared to the initial defect 330.

Figure 7:
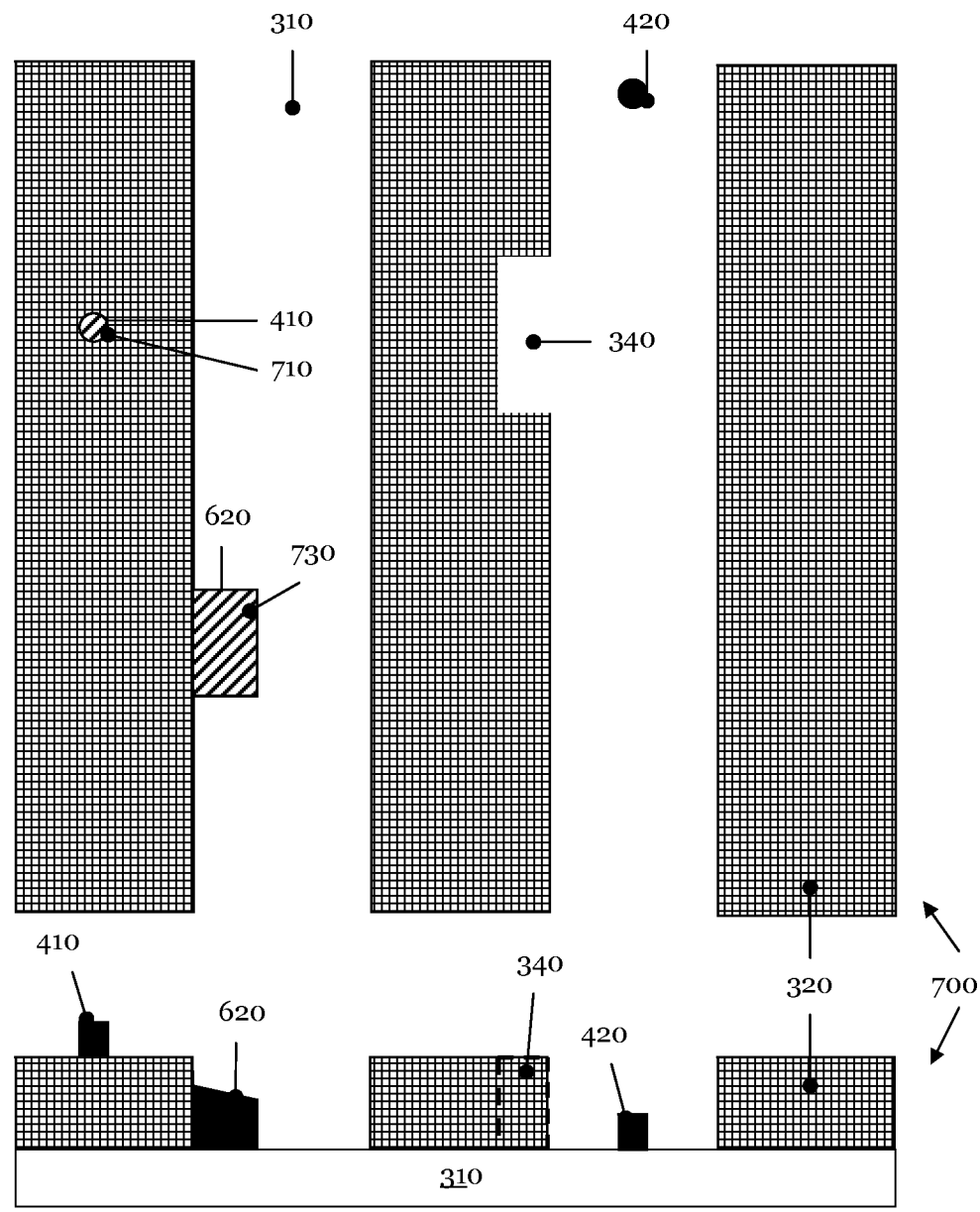
FIG. 7 schematically shows the situation after correction of the drift of FIG. 6.
Figure 8:
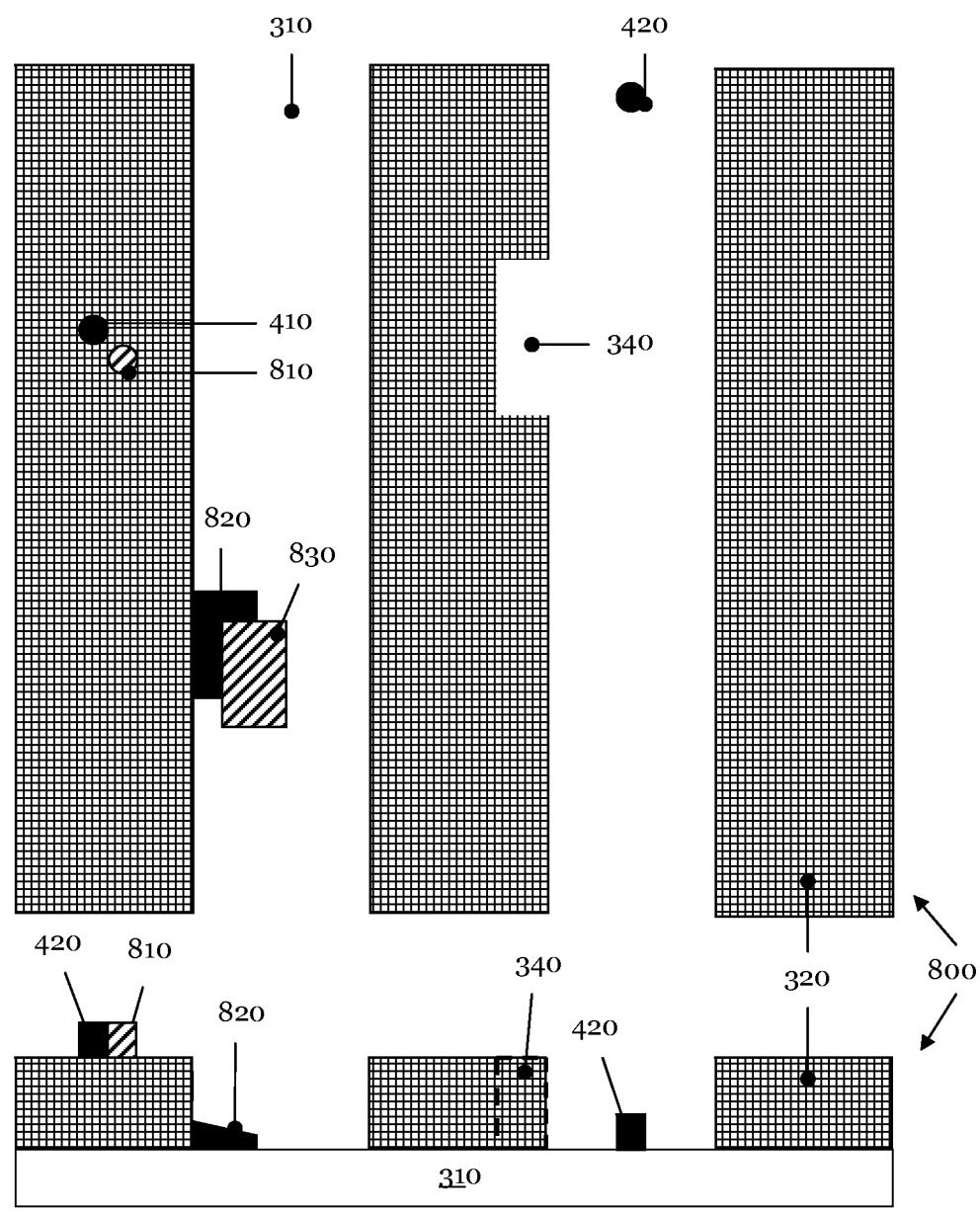
FIG. 8 schematically represents the drift of the particle beam relative to the defect after a second processing period and the remaining black or opaque defect.

When the sample stage no is moved by the distance and direction between the defect 330 or the remaining defect 630 and the DC mark 410, the incident position 610 of the electron beam 127 does not meet the reference mark 410. Therefore, the electron beam 127 is scanned around its present position to identify the DC mark 410. In order to correct the drift acquired by the electron beam 127 relative to the defect 330, the electron beam is again brought in agreement with DC mark 410. This situation is illustrated in FIG. 7. Similar to the start of the correction process indicated in FIG. 5, at the beginning of the second processing period, the defective area 730 scanned by the electron beam 127 coincides with the remaining defect 620. The defective area 730 might be slightly different in size and shape from the actual topographic area 620 in order to correct for process side effects.

Figure 9:
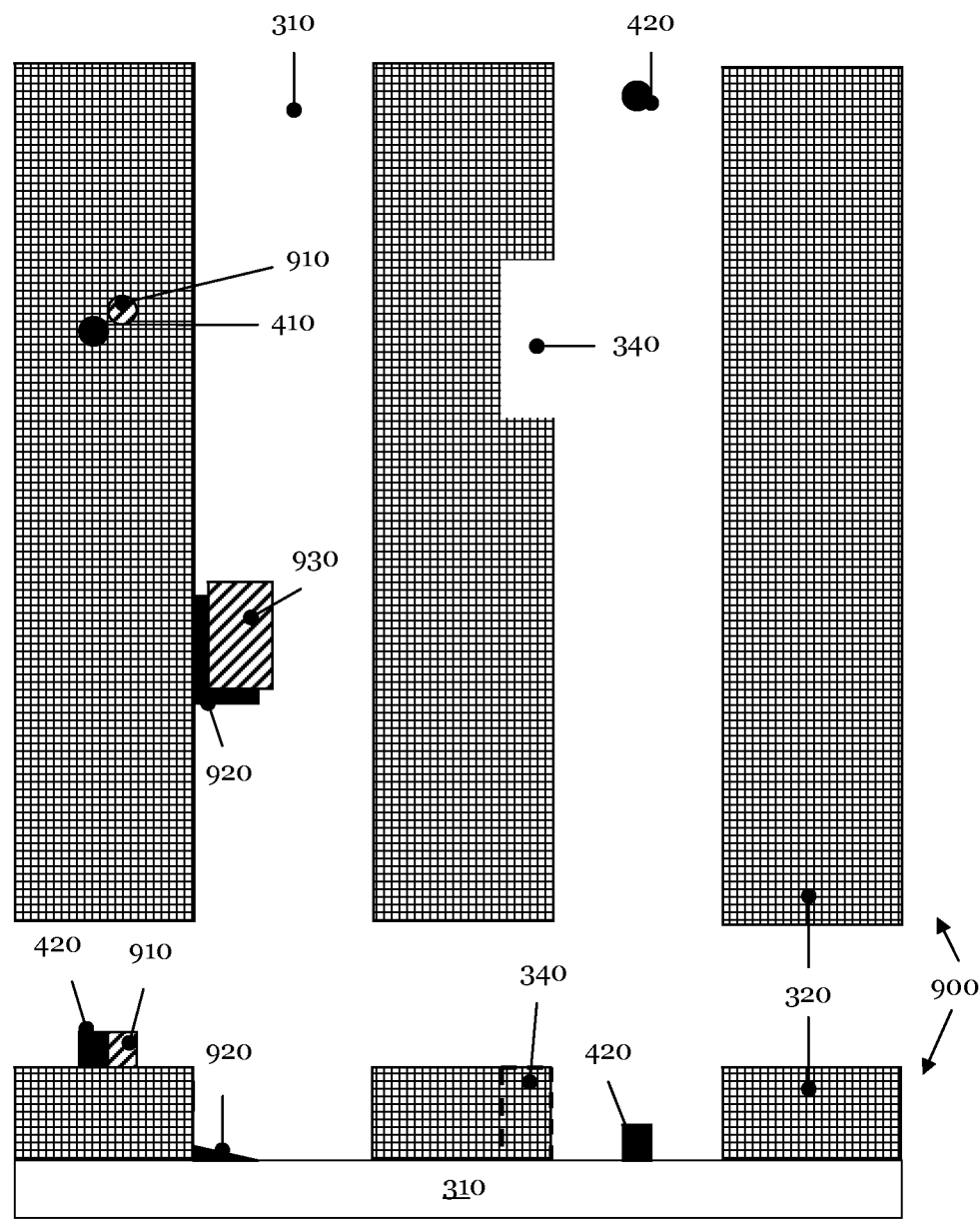
FIG. 9 schematically illustrates the drift between the particle beam and remaining opaque defect after a third processing interval.

Following the scheme explained above, the number of processing periods predetermined in step 225 of the flow chart 200 of FIG. 2 is performed. As indicated in FIG. 9, at the third processing period, the etched area 930 drifts by a different amount and in a different direction compared to the first two processing periods. A reason for the decreasing drift could be that the photolithographic mask 300 reaches a thermal equilibrium. A thermal drift would always be in the same direction. Other effects may additionally be involved, which can not be predicted a priori. For example, such effects may comprises a different charging behaviour between the start and the stop of the processing period and/or a heavier implanted dose in an isolating quartz substrate as the etching process proceeds. Hence, there is a need for the heuristic drift correction algorithm defined in the present application.

The etching of the opaque defect 330 using an electron beam 127 and one or a combination of etching gases can take some time as the EBIE process is a chemical process. As already indicated, this process does not induce a damage of the mask substrate 310. On the other hand, during the processing time the incident position of the electron beam 127 may change relative to the position of defect 330. Thus, the removal of the opaque defect by an EBIE process typically needs more iterations than using an FIB, where a portion or the major part of the defect 330 is removed by the sputter effect of the ions incident on the material of defect 330.

Again with reference to the flow diagram 200 of FIG. 2, at the end of the predetermined etching iteration cycles, at step 255, the remaining opaque effect 920 can be analyzed using the electron beam 127 with a suitable set of parameters. At decision box 260, it can be decided whether the size and/or the height of remaining opaque defect 920 is below a predetermined threshold. If this condition is not fulfilled, the method proceeds to step 235 and performs a further processing period. If the remaining defect 920 is smaller than the predetermined threshold, the method proceeds to decision box 265 where it is decided whether there is a further defect which is to be corrected. If this is correct, the method proceeds to step 225 and determines the parameters for the correction process of the next defect. In the exemplary mask 300 illustrated in FIG. 3, this is the clear defect 340.

Steps 255 and 260 of FIG. 2 are optional steps. The method presented in the flow chart 200 works also when eliminating these steps from the method flow. Step 255 presents a mean to control the success of an error correction process, and step 260 describes a mean to reduce a potentially remaining defect below a predetermined threshold.

As illustrated in FIG. 3, the exemplary photolithographic mask 300 also shows a clear or blank defect 340. To remove the clear defect 340, opaque material is deposited at the position of the defect 340. The deposition of material is performed by using the electron beam 127 and a second precursor gas stored in the storage container 155. The flow of the second precursor gas is controlled by the valve 156. Examples of precursor gases used for repairing or correcting clear defects on photolithographic masks are metal carbonyl. A metal carbonyl which is often selected as a precursor gas is chromium hexacarbonyl ($Cr(CO)_6$). Similar to the deposition of the DC marks 410, 420 described above, a combination or a mixture of two or more precursor gases can also be applied to deposit material at the position of the clear defect 340. For this purpose, the valve 171 controls the flow of the precursor gas stored in the container 170. The valves 151, 156, 161, 166, 171 and 176 can be controlled by the computer system 140. The connection of the valves 151, 156, 161, 166, 171 and 176 to the computer system 140 is not depicted in FIG. 1.

After the selection of the electron beam parameters and the composition and quantity of the second precursor gas(es) provided per time unit, the time period and the number of iteration cycles or the number of processing periods are determined as given in step 225 of the flow diagram 200 of FIG. 2. Similar, as described above at the discussion of the correction of the opaque defect 330, the distance and the direction between the reference mark 420 and the clear defect 340 are determined.

Figure 10:
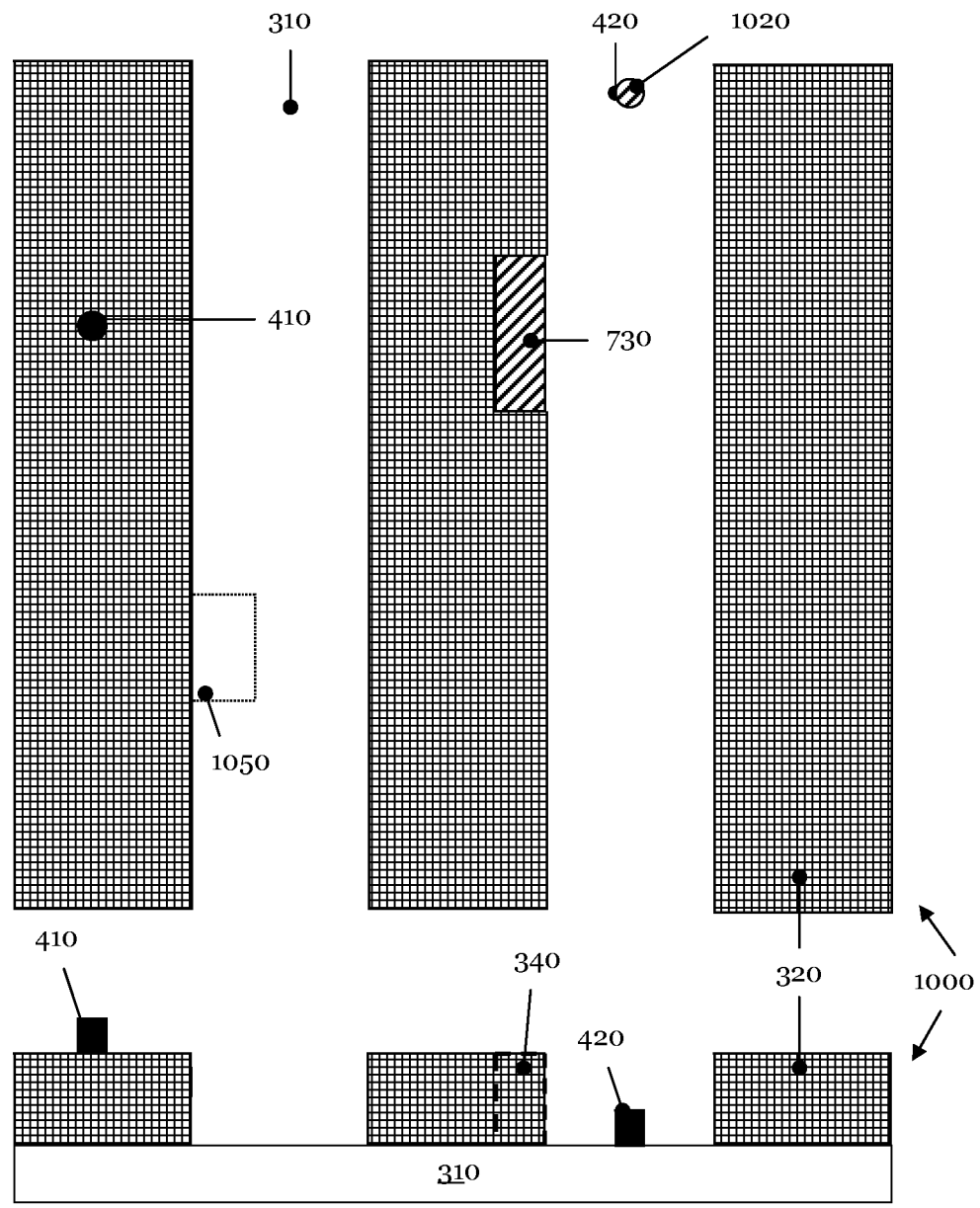
FIG. 10 schematically shows the initial situation for the correction of a blank or a clear defect.

FIG. 10 indicates the starting conditions at the start of the first processing period of the error correction process for the clear defect 340. The position 1020 of the electron beam 127 coincides with DC mark 420. The sample stage 110 is moved by the distance between DC mark 420 and clear defect 340. The electron beam 127 is then scanned across the area 730 which is essentially identical to the area of the defect 420. The energy of the electrons of the electron beam 127 decomposes the precursor gas and the metallic component deposits on the substrate 310 of the mask 300.

Figure 11:
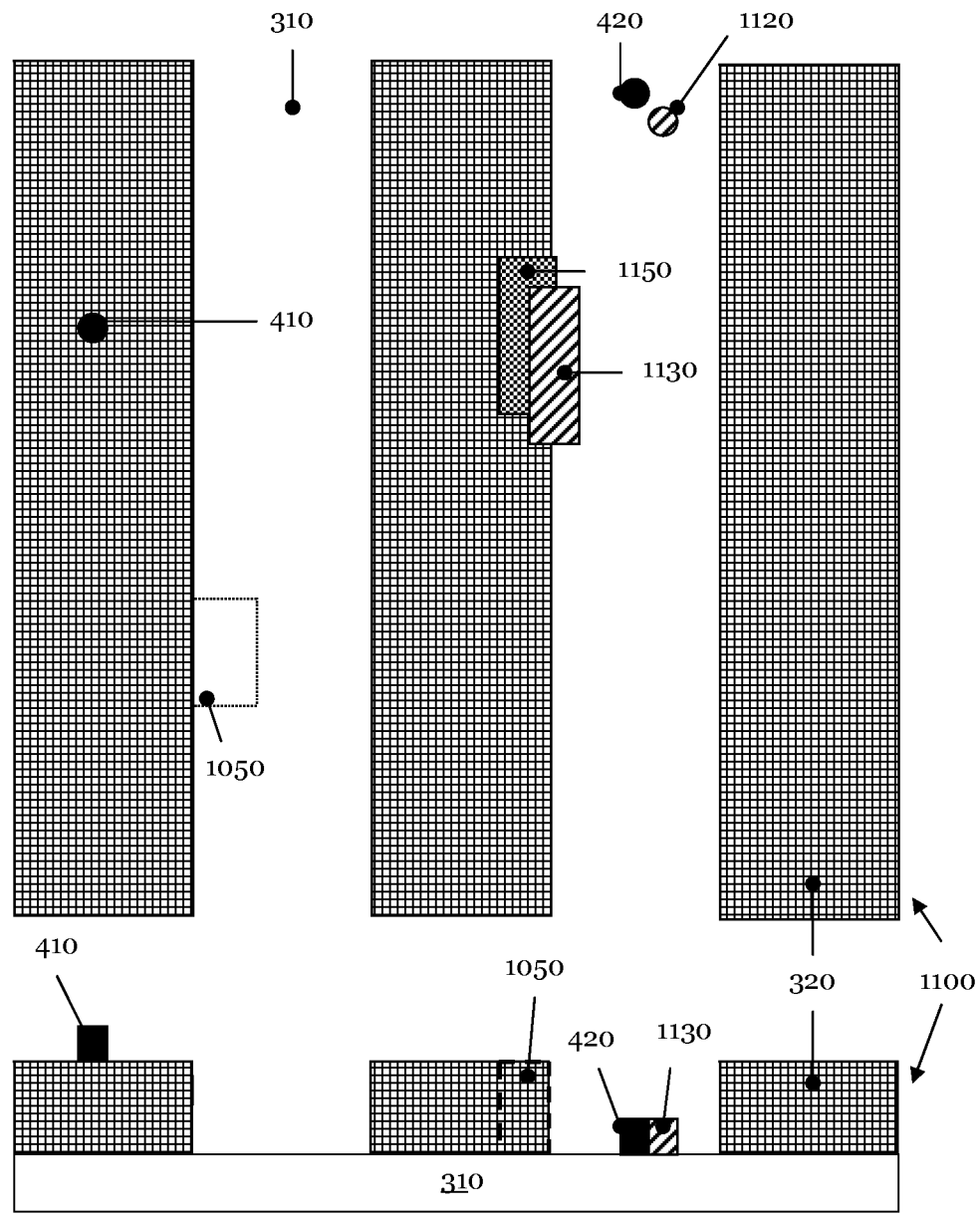
FIG. 11 schematically depicts the drift of the particle beam relative to the clear defect after a first processing period.
Figure 12:
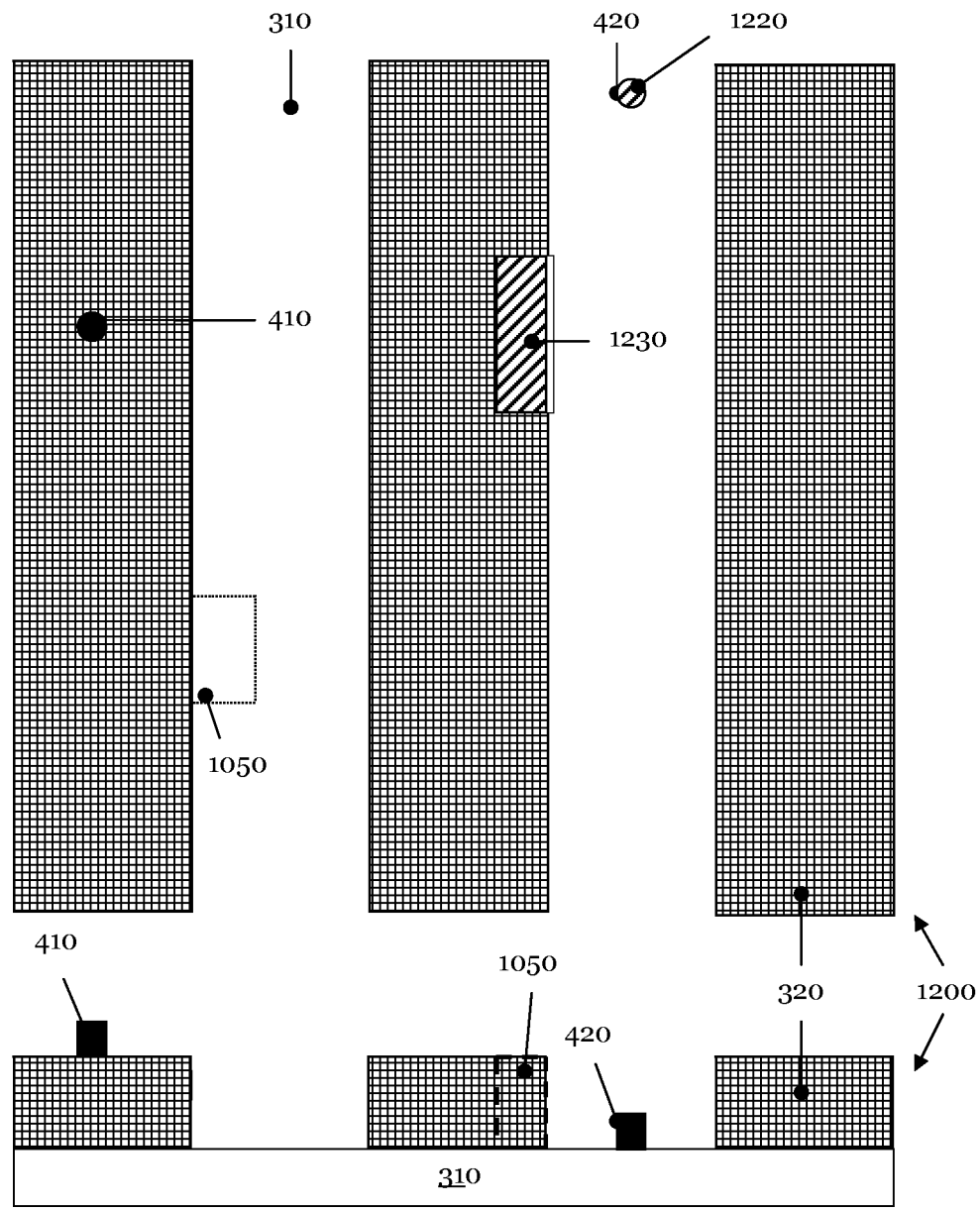
FIG. 12 schematically shows the situation after correction of the drift of FIG. 11.

As explained when discussing the error correction process for the opaque defect 330, the deposition process is interrupted after a determined time period is elapsed. As indicated in FIG. 11, during the processing time period, the area 1130 scanned by the electron beam 127 drifted with respect to the position of the remaining defect 1150. Similar as for the error correction process of the opaque defect 330, the shift of the electron beam 127 relative to the clear defect 420 or the remaining defect 1150 is corrected by using DC mark 420. As indicated in FIG. 12, the position 1220 of the electron beam 127 coincides with the DC mark 420 and the scanned area 1230 or deposition area 1230 coincides with the area of the remaining defect 1150. Then, the second iteration cycle or the second processing period of the deposition process for repairing the clear defect 340 is started.

Figure 13:
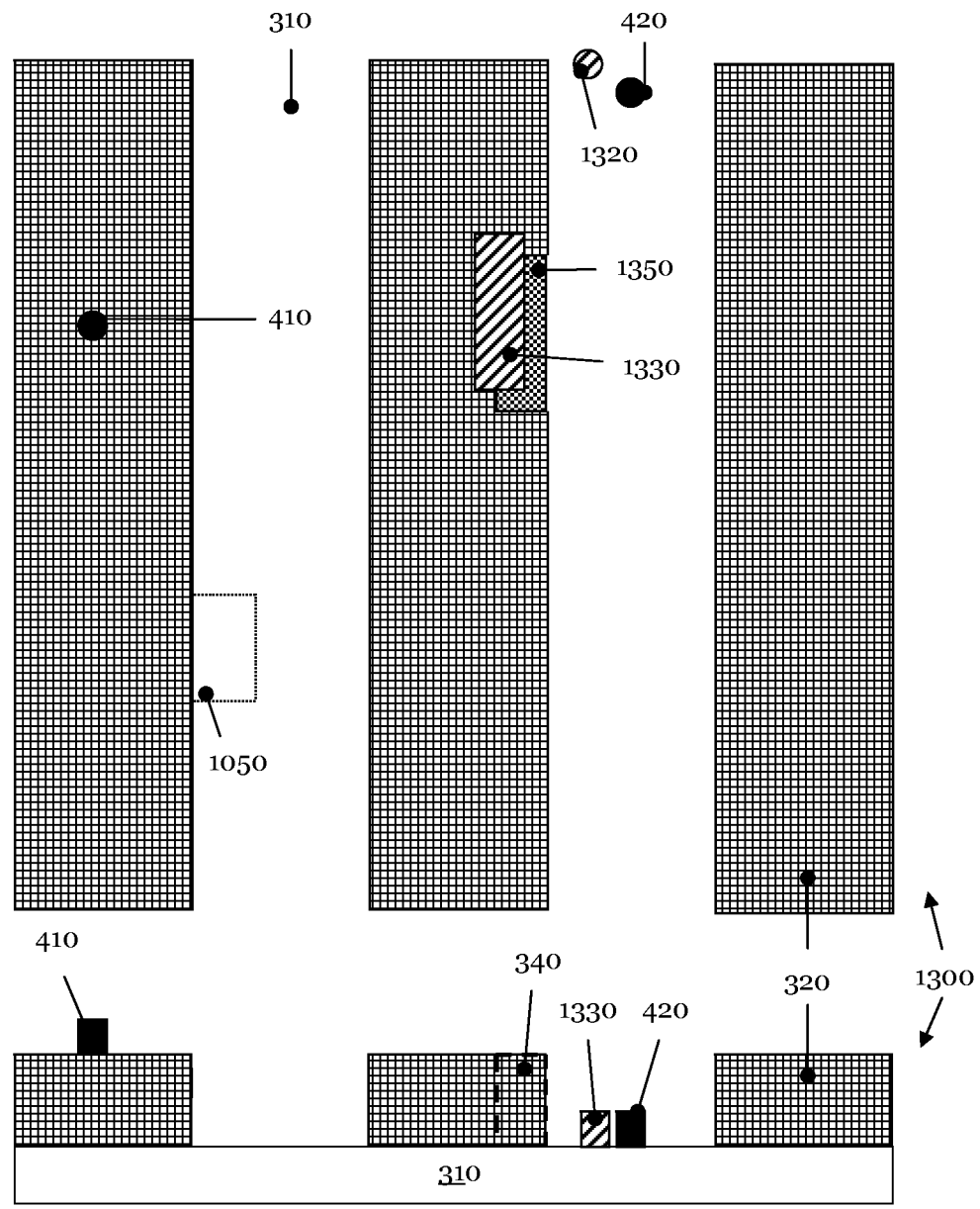
FIG. 13 schematically represents the drift of the particle beam relative to the remaining clear defect after a second processing period.

FIG. 13 illustrates that at the end of the second processing period, the scanned of deposition area 1130 has shifted by a different amount and direction compared to the first iteration cycle or the first processing period. As discussed above, the shift of the relative position between the remaining defect 1350 and the electron beam 127 is corrected with the aid of reference mark 420.

Again with reference to the flow diagram 200 of FIG. 2, at the end of the determined number of iteration cycles or processing periods, the success of the error repairing process can optionally be controlled at step 255. This can be performed by determining the deviation of the corrected area 1450 from the surrounding feature element 320. If it is at decision block 260 decided that the deviation between the deposited material and the respective feature element 320 is larger than a predetermined threshold, a further processing period is added to reduce the deviation. If it is decided at decision block 260 that the repaired defect fulfils the quality criterion of decision block 260, the method proceeds to step 265 where it is decided if there is a further defect on the mask 300 of FIG. 3. If this is not the case, the reference marks 410 and 420 are removed from the photolithographic mask 300.

For the removal of the DC marks 410 and 420, several alternative processes are available. The DC marks can be etched by using the electron beam 127 in combination with the etching gas stored in the container 160. Further, a combination of two or more etching gases stored in the containers 160 and 175 can also be applied for removing the DC marks 410 and 420 in an EBIE process. The valves 161 and 176 can be used to adjust the composition of the etching gas to a specific reference mark. Moreover, the mixing ratio of the etching gas can be adapted to a material composition of a reference mark which may vary with the height of the DC mark. Moreover, an etching gas or a combination of etching gases different from the etching gas(es) used for the correction of the opaque defect 330 can be applied for the removal of the reference mark 410 and 420.

Beside the etching gas and its mixture, respectively, the parameters of the electron beam 127 are adjusted to the respective DC mark 410 and 420. This can be done, since the composition of the DC marks 410 and 420 are known from the parameters of their growth conditions. In order to remove the material etched of the DC mark 410 and 420 from the processing chamber of the apparatus 100, an evacuation device can be applied (not indicated in FIG. 1). This measure avoids a contamination of the vacuum chamber of the apparatus 100.

The removal of the DC marks 410 and 420 with an EBIE process may take some time as the EBIE process is typically a slow process. On the other hand, the EBIE process allows the removal of the reference marks 410 and 420 without moving the mask 300 relative the sample stage no. Therefore, the processing of the photolithographic mask 300 or generally of the substrate no can immediately be continued after the removal of the DC marks 410 and 420. The reference marks 410 and 420 deposited from the deposition gas molybdenum hexacarbonyl ($Mo(CO)_6$) can be etched for instance with a mixture of etching gases $XeF_2$ and water vapour ($H_2O$), and wherein the electron beam has essentially the same parameter values as the ones used for depositing the DC marks 410 and 420. The numerical values of these parameters are given above.

This procedure avoids the need for refocusing the focussed electron beam 127 between for example an absorber etch step and the DC mark removal. On the other hand, using a different gas composition for the DC mark removal than during the absorber step etch of the substrate no may allow for an improved selectivity of this step and guarantees an absence of further damage to the substrate no during the DC mark removal process step.

Different from the exemplary method presented in FIG. 2, it is also possible to generate the reference mark 410, to correct the opaque defect 330 using reference mark 410 and then remove reference mark 410 from the feature element 320 of the mask 300; and then to generate the reference mark 420, to correct the clear defect using reference mark 420 and then remove reference mark 420 from the substrate 310 of the mask 300 of FIG. 3. Further, it is also possible to use a first particle beam for the generation of the DC marks 410 and 420 and a second particle beam for the processing of the substrate.

As the reference marks 410 and 420 are again removed from the mask 300, it is possible to arrange reference mark 420 on the clear substrate 310 of mask 300. This freedom increases the flexibility for the arrangement of the reference marks.

In an alternative embodiment, the photolithographic mask 300, or more generally the substrate 110, is removed from the vacuum chamber of the apparatus 100 of FIG. 1 at the end of the error correction process. The overall mask 300 is inserted in the cleaning device 190 of FIG. 1. The cleaning device 195 contains the cleaning liquid 195. The cleaning liquid 195 may be the cleaning liquid used for cleaning mask 300 of FIG. 3, or the substrate no at the end of an ordinary processing cycle. An example of the cleaning liquid comprises water and/or aqueous solutions such as dilute sulphuric acid or dilute hydrogen peroxide under the action of ultra- or megasonic vibrations and/or in the presence of ultraviolet (UV) or infrared (IR) light, and/or dissolved gases, such as hydrogen ($H_2$) and/or oxygen ($O_2$).

Further, in addition to the conventional cleaning process, the cleaning device 190 can contain a cleaning liquid 195 specifically adapted to the material composition of the DC marks 410 and 420. For example, the reference marks 410 and 420 generated with the precursor gas or deposition gas molybdenum hexacarbonyl ($Mo(CO)_6$) can be removed with a cleaning liquid comprising specific aqueous solutions such as mineral acids, bases, or organic ligands. In a preferred example, the parameters used to deposit the DC marks are tuned so that the removal of the reference marks is possible with the "standard" mask cleaning process, thus avoiding the need for a dedicated cleaning process.

Figure 14:
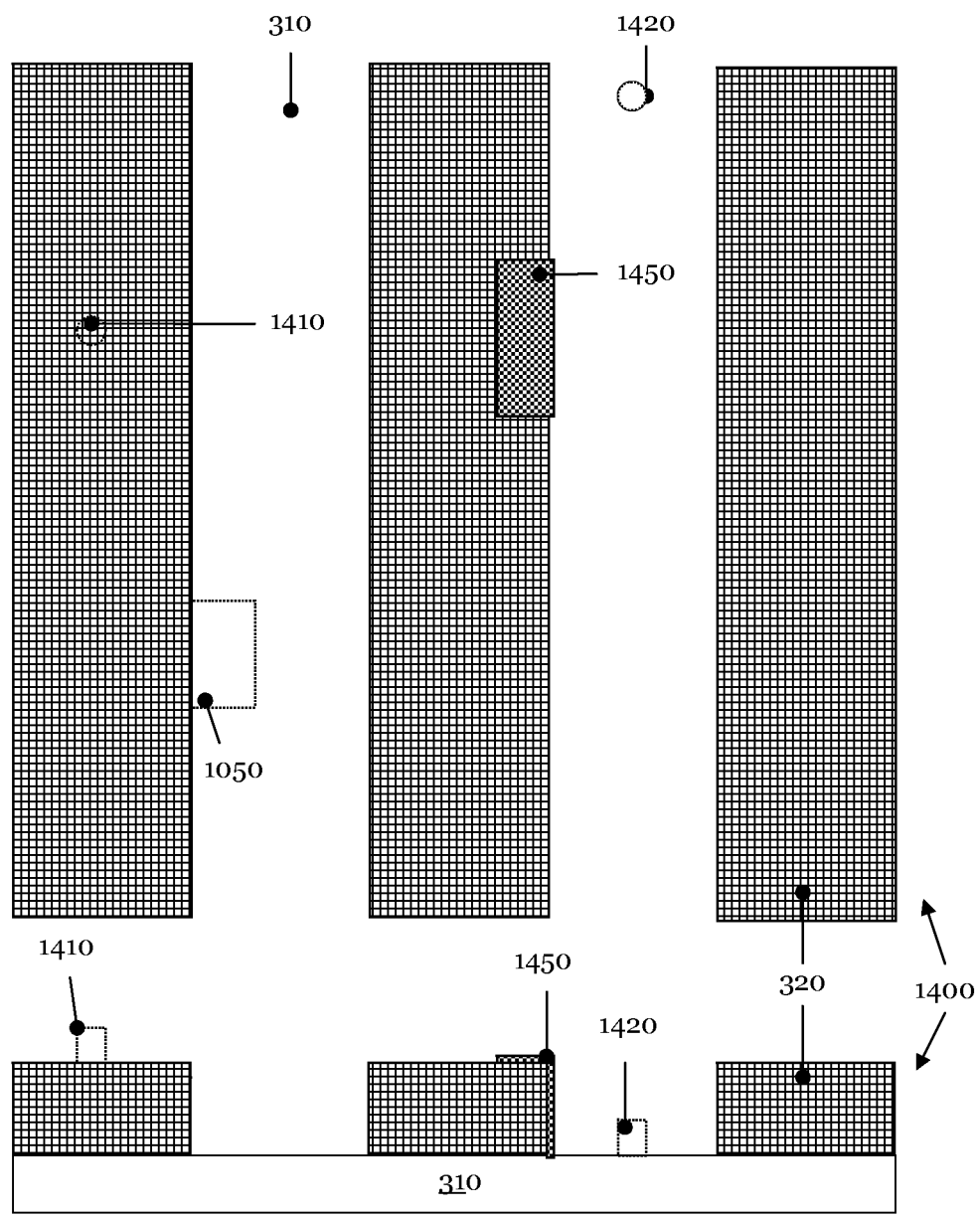
FIG. 14 schematically illustrates the cut-out of the photolithographic mask after correction of the defects of FIG. 3 and the removal of the reference marks of FIG. 4.

FIG. 14 illustrates the cut-out of the mask 300 at the end of the error correction process. The dotted line 1050 indicates the position of the removed opaque defect 330 and the reference numeral 1450 shows the material deposited on the clear defect 340. The corrected feature element 320 is slightly wider at the position of clear defect 340. Moreover, the deposited material is somewhat higher than the surrounding feature element 320. The dotted cycles 1410 and 1420 indicate the position of the removed DC marks 410 and 420. The error correction processes for the opaque defect 330 and the clear defect 340 has been successful as the corrected defects 1050 and 1450 do no longer disturb the phase relationship of the light passing through the transmissive photolithographic mask 300. Even more important, the removed DC marks 1410 and 1420 can not have any effect of the further processing of the mask 300 nor on the quality of the image of the mask generated on a wafer in a photolithographic illumination system.

In an alternative embodiment, the reference marks 410 and 420 in the photolithographic mask 300 are generated by etching a hole in the feature element 320 and a hole in the substrate 310 at the mask 300. The dimensions of the holes are similar as the dimensions of the deposited DC marks 410 and 420. The EBIE process described above can be applied for this purpose. The parameters of the electron beam 127 and the etching gas or the combination of etching gases are adapted to the respective reference mark on the feature element 320 and on the substrate 310 of the mask 300 (not indicated in one of the Figures).

Small holes used as reference marks only provide a topology contrast in an SEM image but no material contrast. Thus, it might be more difficult to identity small holes than deposited DC marks in an SEM image.

After finalization of the error correction process, the holes used as reference marks can be filled by using one precursor gas or by using a mixture or several precursor gases described above. As also discussed above, the electron beam parameters are specific for filling the hole of the feature element 320 on the mask substrate 310 and/or for filling a hole in the substrate 310 of the mask 300.

What is claimed is:

1. A method of processing a substrate with a focussed electron beam which impinges on the substrate, the method comprising:
   a) generating at least one reference mark on a substrate using the focussed electron beam and at least one processing gas which comprises at least one first precursor gas, wherein generating the at least one reference mark comprises depositing a dot of material using the focussed electron beam and the at least one first precursor gas;
   b) determining a reference position of the at least one reference mark;
   c) processing the substrate using the reference position of the reference mark by depositing a removable material around an excess material by using a focussed electron beam and at least one deposition gas, and by removing the excess material together with the removable material, wherein the removable material further comprises molybdenum and oxygen; and
   d) removing the at least one reference mark from the substrate,
   wherein removing the at least one reference mark comprises directing the electron beam and at least one etching gas onto the at least one reference mark.

2. The method of claim 1, wherein b) occurs prior to c).

3. The method of claim 1, wherein processing of the substrate further comprises:
   interrupting processing;
   determining a drift of a position of the at least one reference mark with respect to the reference position; and
   continuing processing of the substrate with the corrected drift.

4. The method of claim 3, wherein processing of the substrate further comprises periodically repeating:
   interrupting processing;
   determining the drift of a position of the at least one reference mark with respect to the reference position; and
   continuing processing of the substrate with the corrected drift.

5. The method of claim 3, wherein processing of the substrate further comprises repeating, based on a signal of a drift sensor:
   interrupting processing;
   determining the drift of a position of the at least one reference mark with respect to the reference position; and
   continuing processing of the substrate with the corrected drift.

6. The method of claim 1, further comprising depositing a sacrificial layer on the substrate and generating the at least one reference mark on the sacrificial layer.

7. The method of claim 6, wherein removing the sacrificial layer is carried out in a cleaning device using a cleaning process, the cleaning process simultaneously removes the at least one reference mark on the sacrificial layer.

8. The method of claim 1, further comprising generating a material contrast difference with respect to the substrate material in an image generated with the focussed electron beam.

9. The method of claim 1, wherein the at least one processing gas comprises at least one of a metal alkyl, a transition element alkyl and a main group element alkyl.

10. The method of claim 9, wherein the at least one of a metal alkyl, a transition element alkyl and a main group element alkyl comprises cyclopentadienyl (Cp) trimethylplatinum ($CpPtMe_3$), methylcyclopentadienyl (MeCp) trimethylplatinum ($MeCpPtMe_3$), tetramethyltin ($SnMe_4$), trimethylgallium ($GaMe_3$), ferrocene cyclopentadienyl ($Cp_2Fe$), and bis-aryl chromium ($Ar_2Cr$).

11. The method of claim 1, wherein the at least one processing gas comprises at least one of a metal carbonyl, a transition element carbonyl and a main group element carbonyl.

12. The method of claim 11, wherein the at least one of a metal carbonyl, a transition element carbonyl and a main group element carbonyl comprises chromium hexacarbonyl ($Cr(CO)_6$), molybdenum hexacarbonyl ($Mo(CO)_6$), tungsten hexacarbonyl ($W(CO)_6$), dicobalt octocarbonyl ($Co_2(CO)_8$), triruthenium dodecarbonyl ($Ru_3(CO)_{12}$), and iron pentacarbonyl ($Fe(CO)_5$).

13. The method of claim 1, wherein the at least one processing gas comprises at least one of a metal alkoxide, a transition element alkoxide and a main group element alkoxide.

14. The method of claim 13, wherein the at least one of a metal alkoxide, a transition element alkoxide and a main group element alkoxide comprises tetraethyl orthosilicate ($Si(OC_2H_5)_4$) and titanium isopropoxide ($Ti(OCH(CH_3)_2)_4$).

15. The method of claim 1, wherein the at least one processing gas comprises at least one of a metal halogenide, a transition element halogenide and a main group element halogenide.

16. The method of claim 15, wherein the at least one of a metal halogenide, a transition element halogenide and a main group element halogenide comprises tungsten hexachloride ($WCl_6$), titanium tetrachloride ($TiCl_4$), boron trichloride ($BCl_3$), and silicon tetrachloride ($SiCl_4$).

17. The method of claim 1, wherein the at least one processing gas comprises at least one of a metal complex, a transition element complex and a main group element complex.

18. The method of claim 17, wherein the at least one of a metal complex, a transition element complex and a main group element complex comprises copper hexafluoroacetylacetonate ($Cu(C_5F_6HO_2)_6$) and dimethyl gold trifluoroacetylacetonate ($Me_2Au(C_5F_3H_4O_2)$).

19. The method of claim 1, wherein the at least one processing gas comprises carbon monoxide (CO), carbon dioxide ($CO_2$), aliphatic or aromatic hydrocarbons, constituents of vacuum pump oil, and volatile organic compounds.

20. The method of claim 1, further comprising providing at least one additive gas, and wherein the at least one additive gas comprises at least one oxidizing agent.

21. The method of claim 20, wherein the at least one oxidizing agent comprises at least one gas selected from the group consisting of oxygen ($O_2$), ozone ($O_3$), water vapour ($H_2O$), hydrogen peroxide ($H_2O_2$), nitrous oxide ($N_2O$), nitrogen oxide (NO), nitrogen dioxide ($NO_2$), nitric acid ($HNO_3$), and oxygen containing gases.

22. The method of claim 1, further comprising providing at least one additive gas, and wherein the at least one additive gas comprises at least one halogenide.

23. The method of claim 22, wherein the at least one halogenide comprises chlorine ($Cl_2$), hydrochloric acid (HCl), xenon difluoride ($XeF_2$), hydrofluoric acid (HF), iodine ($I_2$), hydrogen iodide (HI), bromine ($Br_2$), hydrogen bromide (HBr), nitrosyl chloride (NOCl), phosphor trichloride (($PCl_3$), phosphorus pentachloride ($PCl_5$), phosphorus trifluoride ($PF_3$), nitrogen trifluoride ($NF_3$), and halogen containing gases.

24. The method of claim 1, further comprising providing at least one additive gas, and wherein the at least one additive gas comprises at least one gas having a reducing effect.

25. The method of claim 24, wherein the at least one gas having a reducing effect comprise hydrogen ($H_2$), ammonia ($NH_3$), methane ($CH_4$), and hydrogen containing gases.

26. The method of claim 1, wherein removing the at least one reference mark is carried out in the vacuum chamber used for depositing the at least one reference mark.

27. The method of any of claim 1, wherein removing the excessive material and the removable material is carried out in a cleaning device using a cleaning process.

28. The method of claim 1, wherein a) is performed in a vacuum chamber, and d) is performed in the vacuum chamber.

29. The method of claim 1, wherein the removable material further comprises carbon.

30. A method of processing a substrate with an electron beam which impinges on the substrate, the method comprising:
  a) generating at least one reference mark on the substrate using the electron beam and at least one processing gas, the processing gas comprising at least one precursor gas which comprises at least one deposition gas and at least one additive gas, the at least one additive gas comprising oxidizing agents;
  b) depositing a sacrificial layer on one or more parts of the substrate so that the substrate is covered by the sacrificial layer, and generating the at least one reference mark on the sacrificial layer;
  c) determining a reference position of the at least one reference mark;
  d) processing the substrate using the reference position of the reference mark by depositing a removable material around an excess material by using a focussed electron beam and at least one deposition gas, and by removing the excess material together with the removable material, wherein the removable material further comprises molybdenum and oxygen; and
  e) removing the at least one reference mark from the substrate.

31. The method of claim 30, wherein removing the at least one reference mark is carried out in a cleaning device containing a cleaning liquid, the cleaning liquid comprises water and/or aqueous solutions, the cleaning device configured to produce one or more of ultra- or megasonic vibrations, ultraviolet (UV) or infrared (IR) light, and dissolved gases in the cleaning liquid.

32. The method of claim 30, wherein removing the at least one reference mark is performed in a cleaning device in combination with a final cleaning of the substrate.

33. A method of processing a substrate with an electron beam which impinges on the substrate, the method comprising:
  a) generating at least one reference mark on the substrate using the electron beam and at least one processing gas which comprises at least one first precursor gas, wherein generating the at least one reference mark comprises depositing a dot of material using the electron beam and the at least one first precursor gas;
  b) determining a reference position of the at least one reference mark;
  c) processing the substrate using the reference position of the reference mark by depositing a removable material around an excess material by using a focussed electron beam and at least one deposition gas, and by removing the excess material together with the removable material, wherein the removable material further comprises molybdenum and oxygen; and
  d) completely removing the at least one reference mark from the substrate, wherein removing the at least one reference mark comprises directing the electron beam and at least one etching gas onto the at least one reference mark.

\* \* \* \* \*

UNITED STATES PATENT AND TRADEMARK OFFICE
CERTIFICATE OF CORRECTION

| | |
|---|---|
| PATENT NO. | : 9,721,754 B2 |
| APPLICATION NO. | : 13/103281 |
| DATED | : August 1, 2017 |
| INVENTOR(S) | : Tristan Bret, Petra Spies and Thorsten Hofmann |

It is certified that error appears in the above-identified patent and that said Letters Patent is hereby corrected as shown below:

In the Specification

Column 5, Line 23, delete "(Cp)" and insert -- (Cp), --.

Column 5, Line 24, delete "(MeCp)" and insert -- (MeCp), --.

Column 5, Line 37, delete "dodecarbonyl" and insert -- dodecacarbonyl --.

Column 9, Line 59, delete "no" and insert -- 110 --.

Column 9, Line 61, delete "no" and insert -- 110 --.

Column 11, Line 55, delete "no" and insert -- 110 --.

Column 13, Line 23, delete "and or" and insert -- and/or --.

Column 13, Line 24, delete "and or" and insert -- and/or --.

Column 15, Line 34, delete "no" and insert -- 110 --.

Column 18, Line 7, delete "no" and insert -- 110 --.

Column 18, Line 21, delete "no" and insert -- 110 --.

Column 18, Line 22, delete "no" and insert -- 110 --.

Column 18, Line 47, delete "no" and insert -- 110 --.

Signed and Sealed this
Thirteenth Day of March, 2018

Andrei Iancu
*Director of the United States Patent and Trademark Office*

CERTIFICATE OF CORRECTION (continued)
U.S. Pat. No. 9,721,754 B2

In the Claims

Column 20, Line 40, Claim 10, delete "(Cp)" and insert -- (Cp), --.

Column 20, Line 41, Claim 10, delete "(MeCp)" and insert -- (MeCp), --.

Column 20, Line 44, Claim 10, delete "bis -aryl" and insert -- bis-aryl --.

Column 20, Line 53, Claim 12, delete "dodecarbonyl" and insert -- dodecacarbonyl --.